United States Patent
Rand et al.

(10) Patent No.: US 8,242,493 B2
(45) Date of Patent: Aug. 14, 2012

(54) ORGANIC PHOTOSENSITIVE DEVICES USING SUBPHTHALOCYANINE COMPOUNDS

(75) Inventors: Barry Rand, Leuven (BE); Stephen R. Forrest, Ann Arbor, MI (US); Kristin L. Mutolo, Hollywood, CA (US); Elizabeth Mayo, Ann Arbor, MI (US); Mark E. Thompson, Anaheim Hills, CA (US)

(73) Assignees: The Trustees of Princeton University, Princeton, NJ (US); The Regents of the University of Michigan, Ann Arbor, MI (US); The University of Southern California, Los Angeles, CA (US)

( * ) Notice: Subject to any disclaimer, the term of this patent is extended or adjusted under 35 U.S.C. 154(b) by 0 days.

(21) Appl. No.: 13/150,594

(22) Filed: Jun. 1, 2011

(65) Prior Publication Data
US 2011/0253992 A1   Oct. 20, 2011

Related U.S. Application Data

(60) Division of application No. 12/350,570, filed on May 4, 2009, now Pat. No. 7,973,307, which is a continuation of application No. 11/442,062, filed on May 25, 2006, now abandoned.

(51) Int. Cl.
*H01L 51/46* (2006.01)
(52) U.S. Cl. ............ 257/40; 136/263; 257/E51.014; 257/E51.017; 257/E51.041; 257/E51.042
(58) Field of Classification Search ........... 136/263; 252/623 Q; 257/40, E51.001–E51.052; 438/82, 438/99
See application file for complete search history.

(56) References Cited

U.S. PATENT DOCUMENTS

| 6,121,726 A | 9/2000 | Codama et al. |
| 7,655,860 B2 | 2/2010 | Parsons |
| 2004/0154959 A1 | 8/2004 | Schoebrechts et al. |

FOREIGN PATENT DOCUMENTS

WO   94/24612   10/1994

OTHER PUBLICATIONS

Cao et al., "Synthesis and optical properties of axially bromo-substituted subphthalocyanines" *Dyes and Pigments* 54: 213-219 (2002).
Chen et al., "Synthesis, characterization and third-order nonlinear optical properties of bromo[tri-α-(2,4-dimethyl-3-pentyloxy)subphthalocyanine]boron complex" *Inorganic Chemistry Comm.* 9(2): 187-191 (2006). (Abstract only).
Claessens et al., "Chiral self-discrimination in a M3L2 subphthalocyanine cage" *J. Am. Chem. Soc.* 124(49): 14522-14523 (2002).
Claessens et al., "Highly efficient synthesis of chloro- and phenoxy-substituted subphthalocyanines" *Eur. J. Org. Chem.* 14:2547-2551 (2003).

(Continued)

*Primary Examiner* — Kiesha Bryant
*Assistant Examiner* — Mark Tornow
(74) *Attorney, Agent, or Firm* — Duane Morris LLP

(57) ABSTRACT

An organic photosensitive optoelectronic device includes an anode, a cathode, and a donor-acceptor heterojunction between the anode and the cathode, the heterojunction including a donor-like material and an acceptor-like material, wherein at least one of the donor-like material and the acceptor-like material includes a subphthalocyanine, a subporphyrin, and/or a subporphyrazine compound, wherein the subporphyrin or subporphyrazine compound includes boron.

18 Claims, 8 Drawing Sheets

OTHER PUBLICATIONS

Claessens et al., "Inclusion of $C_{60}$ fullerene in a $M_3L_2$ subphthalocyanine cage" *Chemical Communications* 16: 2113-2115.
Claessens et al., "Structural modulation of the dipolar-octupolar contributions to the NLO response in subphthalocyanines" *J. Phys. Chem. B* 109: 3800-3806 (2005).
Claessens et al., "Subphthalocyanines: Singular nonplanar aromatic compounds—synthesis, reactivity, and physical properties" *Chem. Rev.* 102(3): 835-853 (2002).
Claessens et al., "Synthesis of unsymmetrically substituted subphthalocyanines" *Chem. Eur. J.* 6(12): 2168-2172 (2002).
Claessens et al., "Synthesis, separation and characterization of the topoisomers of fused bicyclic subphthalocyanine dimers" *Angewandte Chemie, Int'l Ed.* 41(14): 2561-2565 (2002).
Claessens et al., A new substitution pattern in subphthalocyanines: Regioselective synthesis and separation of 'ortho' derivatives *Eur. J. Org. Chem.* 8: 1603-1607 (2000).
del Rey et al., "Synthesis and nonlinear optical, photophysical, and electrochemical properties of subphthalocyanines" *J. Am. Chem. Soc.* 120(49): 12808-12817 (1998).
del Rey, et al., "Synthesis of highly conjugated boron (III) subphthalocyanines" *Tetrahedron Lett.* 38(30): 5351-5354 (1997).
Diaz-Garcia et al., "Third harmonic generation spectroscopy of boron subphthalocyanine" *J. Phys. Chem.* 99(41): 14988-14991 (1995).
Ferro et al., "A theoretical study of subphthalocyanine and its nitro- and *tert*butyl- derivatives" *THEOCHEM* 537: 223-234 (2001).
Ferro et al., "Density functional study of the redox processes in subphthalocyanines" *Int'l. J. Quantum Chem.* 91(3): 369-375 (2003).
Ferro et al., "The axial coordination in subphthalocyanines. Geometrical and electronic aspects" *J. Porphyrins and Phthalocyanines* 5(6): 491-499 (2001). (Abstract only)
Fukuda et al., "Cis and trans form of a binuclear subphthalocyanine" *Angewandte Chemie, Int'l Ed.* 41(14): 2565-2568 (2002).
Geyer et al., "Subphthalocyanines: Preparation, reactivity and physical properties" *Synthesis* 9: 1139-1151 (1996).
Gong et al., "A density functional theory of the structure and prperties of the substituted subphthalocyanines" *J. Mol. Structure* 587: 189-197 (2002).
Gonzalez-Rodriguez et al., "Subphthalocyanines: tuneable molecular scaffolds for intramolecular electron and energy transfer processes" *J. Am.. Chem. Soc.* 126(20): 6301-6313 (2004).
Gonzalez-Rodriguez et al., "Tuning photoinduced energy- and electron-transfer events in subphthalocyanine-phthalocyanine dyads" *Chemistry—A European Journal* 11(13): 3881-3893 (2005).
Gonzalez-Rodriguez, D et al., "Energy transfer processes in novel suphthalocyanine-fullerene ensembles" *Organic Letters* 4(3): 335-338 (2002).
Gu et al., "Third-order optical nonlinearities in thin films of a new subphthalocyanine" *Mat. Lett.* 52(6): 404-407 (2002).
Iglesias et al., "Syntheses and photophysical characterization of a subphthalocyanine fused dimer-$C_{60}$dyad".
International Search Report dated Feb. 6, 2008, International Patent Application No. PCT/US2007?011749 filed May 15, 2007.
Kipp et al., "Photophysical and photochemical investigation of a dodecafluorosubphthalocyanine derivative" *J. Phys. Chem. A* 102(28): 5659-5664 (1998).
Kobayashi et al., "A rigid, laterally bridged binuclear subphthalocyanine: The first dimer of aromatic macrocyclic complexes containing boron" *Chem. Comm.* 17: 1203-1205 (1991). (Abstract only).
Kobayashi et al., "First observation of the circular dichroism spectra of chiral subphthalocyanines with $C_3$ symmetry" *Tetrahedron Lett.* 43(23): 4253-4255 (2002).
Kobayashi et al., "Synthesis, spectroscopy, and molecular orbital calculations of subazaporphyrins, subphthalocyanines, subnaphthalocyanines, and compounds derived therefrom by ring expansion" *J. Am. Chem. Soc.* 121(39): 9096-9110 (1999).
Krempl et al., "Synthesis of hexacyanotriphenylene and hexacyanotribenylene" *Synthesis* 12: 1705-1708 (2000).

Kudrevich et al., "Syntheses of trisulfanated phthalocyanines and their derivatives using boron (III) subphthalocyanines as intermediates" *J. Org. Chem.* 61(17): 5706-5707 (1996).
Mannsfeld et al., "LEED and STM investigation of chloro(subphthalocyaninato)boron on Au(1 1 1)" *Surface Science* 525(1-3): 215-221 (2003).
Martin et al., "Subphthalocyanines and subnaphthalocyanines: Non-linear quasi-planar octupolar systems with permanent polarity" *J. Phys. Chem. B* 106(51): 13139-13145 (2002).
Mutolo et al., "Enhanced open-circuit voltage in subphthalocyanine/$C_{60}$ organic photovoltaic cells" *J. Am. Chem. Soc.* 128: 8108-8109 (2006).
Neugebauer, H. et al., "Photophysics and photovoltaic device properties of phthalocyanine-fullerene dyad: conjugated polmer mixtures" *Solar Energy Materials & Solar Cells* 83: 201-209 (2004).
Ohno-Okumura et al., "Synthesis of subphthalocyanine derivatives and their characterization" *Dyes and Pigments* 53(1): 57-56 (2002). (Abstract only).
Olbrechts et al., "Multiphoton fluorescence free hyperpolarizabilities of subphthalocyanines" *Chem. Phys. Lett.* 308(3-4): 173-175 (1999).
Peumans t al., "Small molecular weight organic thin film photodetectors and solar cells" *J. Appl. Phys.* 93(7): 3693-3723 (2003).
Rauschnabel et al., New derivatives and homologues of subphthalocyanine: *Tetrahedron Lett.* 36(10): 1629-1632 (1995).
Rey et al., "Synthesis and nonlinear optical, photophysical, and electrochemical properties of subphthalocyanines" *J. Am. Chem. Soc.* 120: 12808-12817 (1988).
Rodriguez-Morgade et al., "Synthesis, characterization, and properties of subporphyrazines: a new class of nonplanar, aromatic macrocycles with absorption in the green region" *Chem. Eur. J.* 11: 354-360 (2005).
Sastre et al., "Subphthalocyanines: Novel targets for remarkable second-order optical nonlinearities" 118(11): 2746-2747 (1996).
Stork et al., "The synthesis and structure of mixed subphthalocyanine/subnaphthalocyanine complexes" *Tetrahedron Lett.* 40(46): 8055-8058 (1999).
Suzuki et al., "Identifying subphthalocyanine molecule isomers by using a scanning tunneling microscope" *J. Phys. Chem. B.* 107: 3659-3662 (2003).
Suzuki et al., "Overlayer structure of subphthalocyanine derivative deposited on Au (111) surface by a spray jet technique" *Thin Solid Films* 499(1-2): 143-146 (2006).
Vanagi et al., "Characterization of light emissions from subphthalocyanine monolayers using scanning tunneling microscopy" *This Solid Films* 499(1-2): 123-128 (2006).
Wang et al., "Subphthalocyanine film studied with spectroscopic ellipsometry" *Optics Communications* 183(5-6): 445-450 (2000).
Wrobel et al., "Non-radiative deactivation pathways of subphthalocyanine and subnaphthalocyanine dyes and of their mixture" *Spectrochimica Acta, Part A: Molecular and Biomolecular Spectroscopy* 59A(12): 2841-2854 (2003).
Xu et al., "A colorimetric and fluorescent chemodosimeter: fluoride ion sensing by an axial-substituted subphthalocyanine" *J. Mat Chem.* 15(27-28): 2676-2680 (2005).
Yamauchi et al., "The lowest photoexcited triplet state of subphthalocyanine in solid and fluid environments. Time-resolved electron paramagnetic resonance studies" *J. Phys. Chem. A* 107(10): 1478-1485 (2003).
Yang et al., "Theoretical study on stability and nonlinear optical properties of novel subphthalocyanine dimer and trimer" *THEOCHEM* 725(1-3): 127-131 (2005).
Yang et al., "Structure, stability and aromaticity of M—SubPc (M=B, Al, and Ga): Computational study" *Int'l J. Quantum Chem.* 103(1): 54-59 (2005).
Yonehara, H et al., "Photoelectrical properties of double-layer organic solar cells using $C_{60}$ and phthalocyanines" *Thin Solid Films* 278: 108-113 (1996).
Zdravkovski et al., "A comparison of structural and electronic characteristics among suphthalocyanine and phthalocyanine complexes" *THEOCHEM* 717(1-3): 85-89 (2005).
Zyskowski et al., "Compounds in the series from boron subphthalocyanine to boron subnaphthalocyanine" *J. Porphyrins and Phthalocyanines* 4(8): 707-712 (2000). (Abstract only).
Zyskowski et al., "Compounds in the series from boron subphthalocyanine to boron subnaphthalocyanine" *J. Phorphyrins and Phthalocyanines* 4(7): 649-654 (2000). (Abstract only).

ORGANIC PHOTOSENSITIVE DEVICES USING SUBPHTHALOCYANINE COMPOUNDS

This application is a divisional of application Ser. No. 12/350,570, filed on May 4, 2009, now U.S. Pat. No. 7,973,307, which is a continuation of application Ser. No. 11/442,062, filed on May 25, 2006, now abandoned.

UNITED STATES GOVERNMENT RIGHTS

This invention was made with government support under grant DE-AC36-98-GO10337 and sub-contract XAT 5-33636-03, awarded by the U.S. Department of Energy and National Renewable Energy Laboratory. The government has certain rights in this invention.

JOINT RESEARCH AGREEMENT

The claimed invention was made by, on behalf of, and/or in connection with one or more of the following parties to a joint university-corporation research agreement: Princeton University, The University of Southern California, The University of Michigan, and Global Photonic Energy Corporation. The agreement was in effect on and before the date the claimed invention was made, and the claimed invention was made as a result of activities undertaken within the scope of the agreement.

FIELD OF THE INVENTION

The present invention generally relates to organic photosensitive optoelectronic devices. More specifically, it is directed to organic photosensitive optoelectronic devices having a donor acceptor heterojunction, comprising a donor-like material and an acceptor-like material, at least one of the donor-like material and the acceptor-like material comprises a subphthalocyanine, subporphyrin, and/or subporphyrazine material; and/or the device optionally comprises at least one of a blocking layer or a charge transport layer, wherein the blocking layer and/or the charge transport layer comprises a subphthalocyanine, a subporphyrin, and/or a subporphyrazine compound.

BACKGROUND OF THE INVENTION

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

As used herein, the term "rectifying" denotes, inter alia, that an interface has an asymmetric conduction characteristic, i.e., the interface supports electronic charge transport preferably in one direction. The term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers. As used herein, "top" means furthest away from the substrate, while "bottom" means closest to the substrate. There may be intervening layers, unless it is specified that the first layer is "in physical contact with" the second layer.

When electromagnetic radiation of an appropriate energy is incident upon an organic semiconductor material, a photon can be absorbed to produce an excited molecular state. In organic photoconductive materials, the generated molecular state is generally believed to be an "exciton," i.e., an electron-hole pair in a bound state which is transported as a quasi-particle. An exciton can have an appreciable life-time before geminate recombination ("quenching"), which refers to the original electron and hole recombining with each other (as opposed to recombination with holes or electrons from other pairs). To produce a photocurrent, the electron-hole forming the exciton is typically separated at a rectifying junction.

In the case of photosensitive devices, the rectifying junction is referred to as a photovoltaic heterojunction. Types of organic photovoltaic heterojunctions include a donor-acceptor heterojunction formed at an interface of a donor material and an acceptor material, and a Schottky-barrier heterojunction formed at the interface of a photoconductive material and a metal.

FIG. 1 is an energy-level diagram illustrating an example donor-acceptor heterojunction. In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material.

As used herein, a first HOMO or LUMO energy level is "greater than" or "higher than" a second HOMO or LUMO energy level if the first energy level is closer to the vacuum energy level 10. A higher HOMO energy level corresponds to an ionization potential ("IP") having a smaller absolute energy relative to a vacuum level. Similarly, a higher LUMO energy level corresponds to an electron affinity ("EA") having a smaller absolute energy relative to vacuum level. On a conventional energy level diagram, with the vacuum level at the top, the LUMO energy level of a material is higher than the HOMO energy level of the same material.

After absorption of a photon 6 in the donor 152 or the acceptor 154 creates an exciton 8, the exciton 8 disassociates at the rectifying interface. The donor 152 transports the hole (open circle) and the acceptor 154 transports the electron (dark circle).

A significant property in organic semiconductors is carrier mobility. Mobility measures the ease with which a charge carrier can move through a conducting material in response to an electric field. In the context of organic photosensitive devices, a material that conducts preferentially by electrons due to a high electron mobility may be referred to as an electron transport material. A material that conducts preferentially by holes due to a high hole mobility may be referred to as a hole transport material. A layer that conducts preferentially by electrons, due to mobility and/or position in the device, may be referred to as an electron transport layer ("ETL"). A layer that conducts preferentially by holes, due to mobility and/or position in the device, may be referred to as a hole transport layer ("HTL"). Preferably, but not necessarily, an acceptor material is an electron transport material and a donor material is a hole transport material.

How to pair two organic photoconductive materials to serve as a donor and an acceptor in a photovoltaic heterojunction based upon carrier mobilities and relative HOMO and LUMO levels is well known in the art, and is not addressed here.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

Padinger, et al., *Adv. Fund. Mater.*, 2003, 13, 85-88, reported photovoltaic cells, comprising polymer-fullerene heterojunctions that reportedly had power conversion efficiencies averaging 3 to 4 percent. Efficiencies approaching 5 percent were reportedly also obtained through variations in the processing techniques. Efficiencies as high as 4 percent under 4 suns simulated AM1.5G illumination in a double-heterostructure copper phthalocyanine (CuPc)/$C_{60}$ thin film cell with Ag as the metal cathode have been reported by Xue, et al., *Appl. Phys. Lett.*, 2004, 84, 3013-3015. PV cells, enhanced by stacking two cells in series, and yielding efficiencies exceeding 5.5 percent have also been reported. Xue, et al., *Appl. Phys. Lett.* 2004, 85, 5757-5759.

For additional background explanation and description of the state of the art for organic photosensitive devices, including their general construction, characteristics, materials, and features, U.S. Pat. No. 6,657,378 to Forrest et al, U.S. Pat. No. 6,580,027 to Forrest et al., and U.S. Pat. No. 6,352,777 to Bulovic et al. are incorporated herein by reference.

Further improvements in the efficiency of organic photosensitive devices would clearly be advantageous. The present invention provides such organic photosensitive devices with improved efficiency.

SUMMARY OF THE INVENTION

The invention is directed to organic photosensitive optoelectronic devices, comprising an anode, a cathode, and a donor-acceptor heterojunction between the anode and the cathode. The heterojunction comprises a donor-like material and an acceptor-like material, where at least one of the donor-like material and the acceptor-like material comprises a subphthalocyanine, a subporphyrin, and/or a subporphyrazine compound; and/or the device optionally comprises at least one of a blocking layer or a charge transport layer, wherein the blocking layer and/or the charge transport layer comprises a subphthalocyanine, a subporphyrin, and/or a subporphyrazine compound.

The invention is further directed to a method of preparing a heterojunction, where the heterojunction comprises a donor-like material and an acceptor-like material. The method comprises selecting a donor-like material having a LUMO and a HOMO, selecting a subphthalocyanine, a subporphyrin, or a subporphyrazine material, substituted with at least one electron withdrawing or electron donating substituent group, wherein the substituent group modulates the subphthalocyanine, subporphyrin, or subporphyrazine material LUMO and HOMO, such that the subphthalocyanine, subporphyrin, or subporphyrazine material is an acceptor-like material for the donor-like material, and forming a heterojunction from the donor-like and acceptor like materials; or selecting an acceptor-like material, selecting a subphthalocyanine, a subporphyrin, or a subporphyrazine material, substituted with at least one electron withdrawing or electron donating substituent group, wherein the substituent group modulates the subphthalocyanine, subporphyrin, or subporphyrazine material LUMO and HOMO, such that the subphthalocyanine, subporphyrin, or subporphyrazine material is a donor-like material for the acceptor-like material, and forming a heterojunction from the donor-like and acceptor like materials.

The figures are not necessarily drawn to scale.

DETAILED DESCRIPTION

Figure 1:
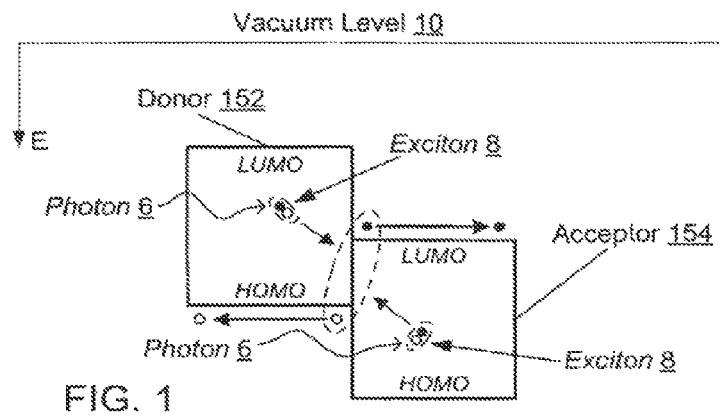
FIG. 1 is an energy level diagram illustrating a donor-acceptor heterojunction.
Figure 2:
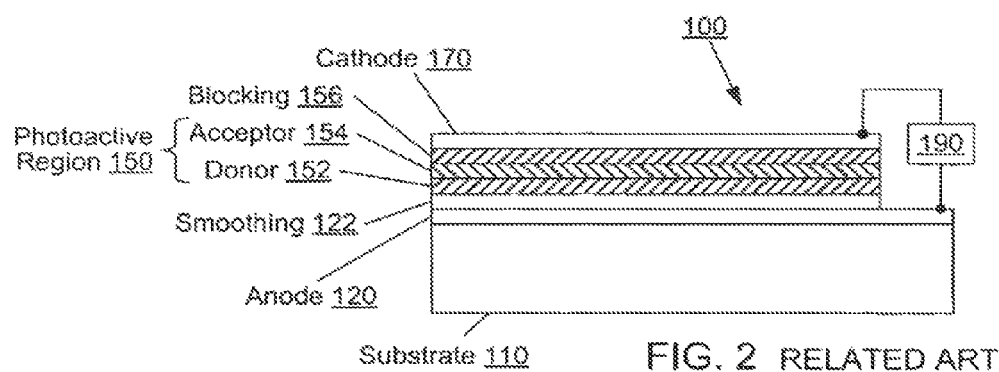
FIG. 2 illustrates an organic photosensitive device including a donor-acceptor heterojunction.

An organic photosensitive device comprises at least one photoactive region in which light is absorbed to form an exciton, which may subsequently dissociate into an electron and a hole. FIG. 2 shows an example of an organic photosensitive optoelectronic device 100 in which the photoactive region 150 comprises a donor-acceptor heterojunction. The "photoactive region" is a portion of a photosensitive device that absorbs electromagnetic radiation to generate excitons that may dissociate in order to generate an electrical current. Device 100 comprises an anode 120, an anode smoothing layer 122, a donor 152, an acceptor 154, an exciton blocking layer ("EBL") 156, and a cathode 170, over a substrate 110.

Examples of EBL 156 are described in U.S. Pat. No. 6,451, 415 to Forrest et al., which is incorporated herein by reference for its disclosure related to EBLs. Additional background explanation of EBLs may also be found in Peumans et al., "Efficient photon harvesting at high optical intensities in ultra-thin organic double-heterostructure photovoltaic diodes," *Applied Physics Letters* 76, 2650-52 (2000). EBLs reduce quenching by preventing excitons from migrating out of the donor and/or acceptor materials.

The terms "electrode" and "contact" are used interchangeably herein to refer to a layer that provides a medium for delivering photo-generated current to an external circuit or providing a bias current or voltage to the device. As illustrated in FIG. 2, anode 120 and cathode 170 are examples. Electrodes may be composed of metals or "metal substitutes." Herein the term "metal" is used to embrace both materials composed of an elementally pure metal, and also metal alloys which are materials composed of two or more elementally pure metals. The term "metal substitute" refers to a material that is not a metal within the normal definition, but which has the metal-like properties such as conductivity, such as doped wide-bandgap semiconductors, degenerate semiconductors, conducting oxides, and conductive polymers. Electrodes may comprise a single layer or multiple layers (a "compound" electrode), may be transparent, semi-transparent, or opaque. Examples of electrodes and electrode materials include those disclosed in U.S. Pat. No. 6,352,777 to Bulovic et al., and U.S. Pat. No. 6,420,031, to Parthasarathy, et al., each incorporated herein by reference for disclosure of these respective features. As used herein, a layer is said to be "transparent" if it transmits at least 50 percent of the ambient electromagnetic radiation in a relevant wavelength.

The substrate 110 may be any suitable substrate that provides desired structural properties. The substrate may be flexible or rigid, planar or non-planar. The substrate may be transparent, translucent, or opaque. Rigid plastics and glass are examples of preferred rigid substrate materials. Flexible plastics and metal foils are examples of preferred flexible substrate materials.

An anode-smoothing layer 122 may be situated between the anode layer 120 and the donor layer 152. Anode-smoothing layers are described in U.S. Pat. No. 6,657,378 to Forrest et al., incorporated herein by reference for its disclosure related to this feature.

In FIG. 2, the photoactive region 150 comprises the donor material 152 and the acceptor material 154. Organic materials for use in the photoactive region may include organometallic compounds, including cyclometallated organometallic compounds. The term "organometallic" as used herein is as generally understood by one of ordinary skill in the art and as given, for example, in Chapter 13 of "Inorganic Chemistry" (2nd Edition) by Gary L. Miessler and Donald A. Tarr, Prentice Hall (1999).

Organic layers may be fabricated using vacuum deposition, spin coating, organic vapor-phase deposition, inkjet printing, and other methods known in the art.

Figure 3:
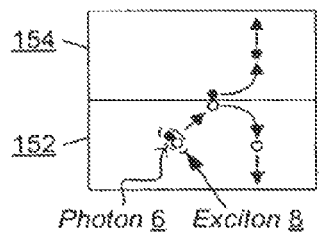
FIG. 3 illustrates a donor-acceptor bilayer forming a planar heterojunction.
Figure 4:
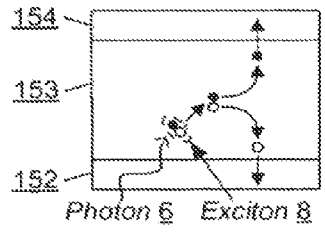
FIG. 4 illustrates a hybrid heterojunction including a mixed heterojunction between a donor layer and an acceptor layer.
Figure 5:
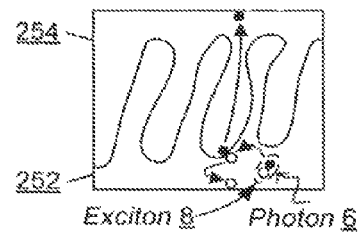
FIG. 5 illustrates a bulk heterojunction.

Examples of various types of donor-acceptor heterojunctions are shown in FIGS. 3-5. FIG. 3 illustrates a donor-acceptor bilayer forming a planar heterojunction. FIG. 4 illustrates a hybrid heterojunction including a mixed heterojunction 153 comprising a mixture of donor and acceptor materials. FIG. 5 illustrates an idealized "bulk" heterojunction. A bulk heterojunction, in the ideal photocurrent case, has a single continuous interface between the donor material 252 and the acceptor material 254, although multiple interfaces typically exist in actual devices. Mixed and bulk heterojunctions can have multiple donor-acceptor interfaces as a result of having plural domains of material. Domains that are surrounded by the opposite-type material (e.g., a domain of donor material surrounded by acceptor material) may be electrically isolated, such that these domains do not contribute to photocurrent. Other domains may be connected by percolation pathways (continuous photocurrent pathways), such that these other domains may contribute to photocurrent. The distinction between a mixed and a bulk heterojunction lies in degrees of phase separation between donor and acceptor materials. In a mixed heterojunction, there is very little or no phase separation (the domains are very small, e.g., less than a few nanometers), whereas in a bulk heterojunction, there is significant phase separation (e.g., forming domains with sizes of a few nanometers to 100 nm).

Small-molecule mixed heterojunctions may be formed, for example, by co-deposition of the donor and acceptor materials using vacuum deposition or vapor deposition. Small-molecule bulk heterojunctions may be formed, for example, by controlled growth, co-deposition with post-deposition annealing, or solution processing. Polymer mixed or bulk heterojunctions may be formed, for example, by solution processing of polymer blends of donor and acceptor materials.

If a photoactive region includes a mixed layer (153) or bulk layers (252, 254) and one or both of the donor (152) and acceptor layers (154), the photoactive region is said to include a "hybrid" heterojunction. The arrangement of layers in FIG. 4 is an example. For additional explanation of hybrid heterojunctions, Published U.S. Patent Application 2005/0224113 A1, entitled "High efficiency organic photovoltaic cells employing hybridized mixed-planar heterojunctions" by Jiangeng Xue et al., published Oct. 13, 2005, is hereby incorporated by reference.

In general, planar heterojunctions have good carrier conduction, but poor exciton dissociation; a mixed layer has poor carrier conduction and good exciton dissociation, and a bulk heterojunction has good carrier conduction and good exciton dissociation, but may experience charge build-up at the end of the material "cul-de-sacs," lowering efficiency. Unless otherwise stated, planar, mixed, bulk, and hybrid heterojunctions may be used interchangeably as donor-acceptor heterojunctions throughout the embodiments disclosed herein.

Figure 6:
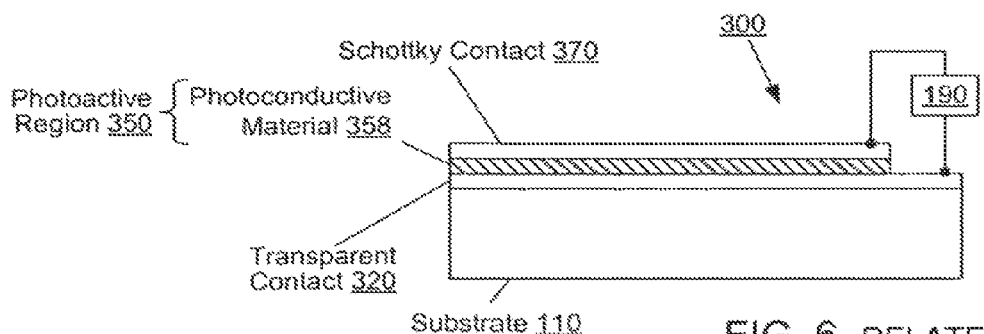
FIG. 6 illustrates an organic photosensitive device including a Schottky-barrier heterojunction.

FIG. 6 shows an example of an organic photosensitive optoelectronic device 300 in which the photoactive region 350 is part of a Schottky-barrier heterojunction. Device 300 comprises a transparent contact 320, a photoactive region 350 comprising an organic photoconductive material 358, and a Schottky contact 370. The Schottky contact 370 is typically formed as a metal layer. If the photoconductive layer 358 is an ETL, a high work function metal such as gold may be used, whereas if the photoconductive layer is an HTL, a low work function metal such as aluminum, magnesium, or indium may be used. In a Schottky-barrier cell, a built-in electric field associated with the Schottky barrier pulls the electron and hole in an exciton apart. Generally, this field-assisted exciton dissociation is not as efficient as the disassociation at a donor-acceptor interface.

The devices as illustrated may be connected to an element 190. If the device is a photovoltaic device, element 190 is a resistive load which consumes or stores power. If the device is a photodetector, element 190 is a current detecting circuit which measures the current generated when the photodetector is exposed to light, and which may apply a bias to the device (as described for example in Published U.S. Patent Application 2005-0110007 A1, published May 26, 2005 to Forrest et al.). If the rectifying junction is eliminated from the device (e.g., using a single photoconductive material as the photoactive region), the resulting structures may be used as a photoconductor cell, in which case the element 190 is a signal detection circuit to monitor changes in resistance across the device due to the absorption of light. Unless otherwise stated, each of these arrangements and modifications may be used for the devices in each of the drawings and embodiments disclosed herein.

An organic photosensitive optoelectronic device may also comprise transparent charge transfer layers, electrodes, or charge recombination zones. A charge transfer layer may be organic or inorganic, and may or may not be photoconductively active. A charge transfer layer is similar to an electrode, but does not have an electrical connection external to the device and only delivers charge carriers from one subsection of an optoelectronic device to the adjacent subsection. A charge recombination zone is similar to a charge transfer layer, but allows for the recombination of electrons and holes between adjacent subsections of an optoelectronic device. A charge recombination zone may include semi-transparent metal or metal substitute recombination centers comprising nanoclusters, nanoparticles, and/or nanorods, as described for example in U.S. Pat. No. 6,657,378 to Forrest et al.; Published U.S. Patent Application 2006-0032529 A1, entitled "Organic Photosensitive Devices" by Rand et al., published Feb. 16, 2006; and Published U.S. Patent Application 2006-0027802 A1, entitled "Stacked Organic Photosensitive Devices" by Forrest et al., published Feb. 9, 2006;each incorporated herein by reference for its disclosure of recombination zone materials and structures. A charge recombination zone may or may not include a transparent matrix layer in which the recombination centers are embedded. A charge transfer layer, electrode, or charge recombination zone may serve as a cathode and/or an anode of subsections of the optoelectronic device. An electrode or charge transfer layer may serve as a Schottky contact.

Figure 7:
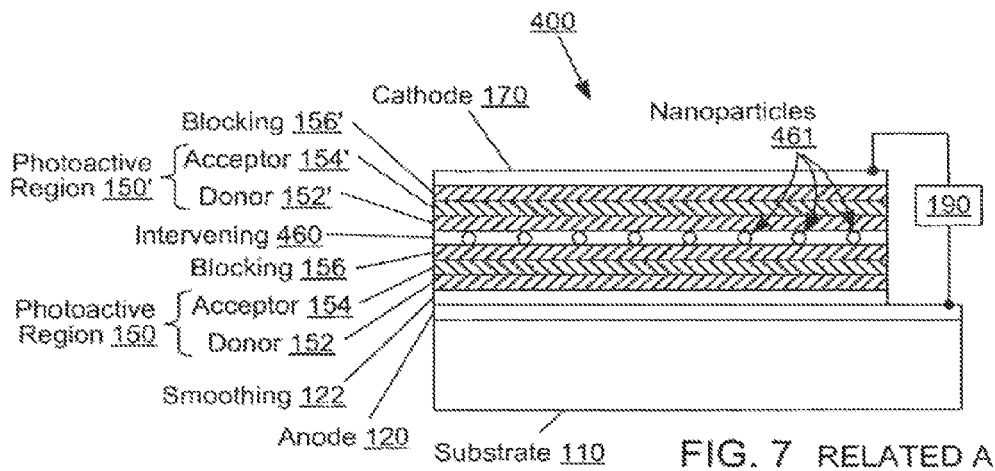
FIG. 7 illustrates tandem photosensitive cells in series.
Figure 8:
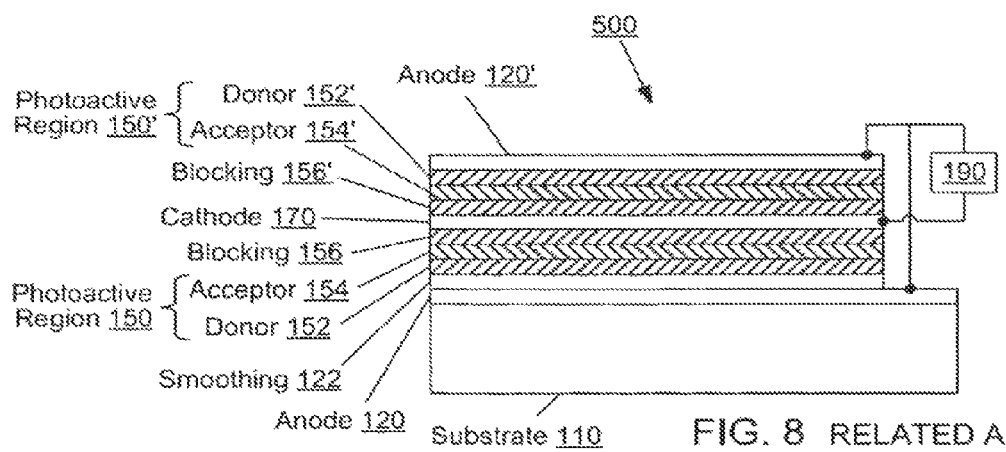
FIG. 8 illustrates tandem photosensitive cells in parallel.

FIGS. 7 and 8 illustrate examples of tandem devices including such transparent charge transfer layers, electrodes, and charge recombination zones. In device 400, in FIG. 7, photoactive regions 150 and 150' are stacked electrically in series with an intervening conductive region 460. As illustrated without external electrical connections, intervening conductive region 460 may be a charge recombination zone or may be a charge transfer layer. As a recombination zone, region 460 comprises recombination centers 461 with or without a transparent matrix layer. If there is no matrix layer, the arrangement of material forming the zone may not be continuous across the region 460. Device 500, in FIG. 8, illustrates photoactive regions 150 and 150' stacked electrically in parallel, with the top cell being in an inverted configuration (i.e., cathode-down). In each of FIGS. 7 and 8, the photoactive regions 150 and 150' and blocking layers 156 and 156' may be formed out of the same respective materials, or different materials, depending upon the application. Likewise, photoactive regions 150 and 150' may be a same type (i.e., planar, mixed, bulk, hybrid) of heterojunction, or may be of different types.

In each of the devices described above, layers may be omitted, such as the exciton blocking layers. Other layers may be added, such as reflective layers or additional photoactive regions. The order of layers may be altered or inverted. A concentrator or trapping configuration may be employed to increase efficiency, as disclosed, for example in U.S. Pat. No. 6,333,458 to Forrest et al. and U.S. Pat. No. 6,440,769 to Peumans et al., which are incorporated herein by reference. Coatings may be used to focus optical energy into desired regions of a device, as disclosed, for example in Published US Patent Application No. 2005-0266218 A1, entitled "Aperiodic dielectric multilayer stack" by Peumans et al., published Dec. 1, 2005, which is incorporated herein by reference. In the tandem devices, transparent insulative layers may be formed between cells, with the electrical connection between the cells being provided via electrodes. In addition, in the tandem devices, one or more of the photoactive regions may be a Schottky-barrier heterojunction instead of a donor-acceptor heterojunction. Arrangements other than those specifically described may be used.

As used herein, the terms "subphthalocyanine compounds" and "SubPc" refer to compounds of formula

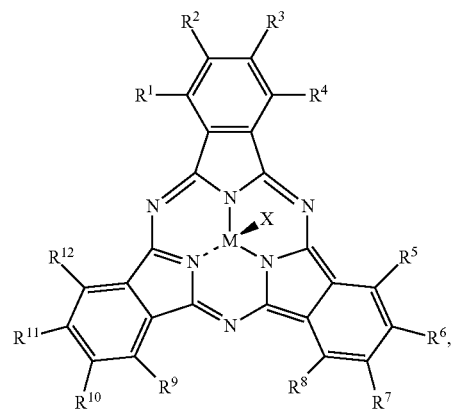

where $R_1$ to $R_{12}$, M, and X are each selected independently. $R_1$ to $R_{12}$ may be electron withdrawing or electron donating, and are preferably independently selected from the group consisting of H, straight, branched, or cyclic alkyl, halide, thioalkyl (e.g., $SC_8H_{17}$) thioaryl (e.g., $SC_6H_5$), arylsulfonyl (e.g. $SO_2C_6H_5$), alkylsufonyl (e.g., $SO_2C_8H_{17}$), amino, alkylamino, arylamino, hydroxy, alkoxy, acylamino, acyloxy, phenyl, carboxy, carboxoamido, carboalkoxy, acyl, sulfonyl, cyano, nitro, and related electron accepting and donating groups, well known to those skilled in the art. In addition, any two adjacent R groups ($R_1$ to $R_{12}$) can be part of a fused aromatic (including heterocyclic) ring, M is boron or a divalent metal, such as Be or Mg, or a trivalent metal, such as Al or Ga, and X is an anionic group, such as halide (fluoride, chloride, bromide, or iodide), alkoxy, phenoxy, hydroxy, aryl, phenyl, and $OCOCR_{13}R_{14}R_{15}$, where $R_{13}$, $R_{14}$, and $R_{15}$ may be electron withdrawing or electron donating, and are preferably independently selected from the group consisting of H, straight, branched, or cyclic alkyl, halide, thioalkyl (e.g., $SC_8H_{17}$) thioaryl (e.g., $SC_6H_5$), arylsulfonyl (e.g. $SO_2C_6H_5$), alkylsufonyl (e.g., $SO_2C_8H_{17}$), amino, alkylamino, arylamino, hydroxy, alkoxy, acylamino, acyloxy, phenyl, carboxy, carboxoamido, carboalkoxy, acyl, sulfonyl, cyano, nitro, and related electron accepting and donating groups, well known to those skilled in the art. Preferably, M is B or Al, and, most preferably, M is B. Any of $R_1$ to $R_{12}$ that are adjacent can be part of a fused aliphatic or aromatic ring, where the ring may contain one or more atoms other than carbon, such as N, O, and S.

As used herein, "$SubPc_{BCl}$" refers to boron subphthalocyanine chloride, a SubPc compound in which M is B, X is Cl, and each of $R_1$ to $R_{12}$ is H. Subphthalocyanine compounds may be prepared using the processes disclosed by Geyer et al., Subphthalocyanines: Preparation, Reactivity and Physical Properties, Synthesis, September 1996, 1139-51, Rauschnabel et al., New Derivatives and Homologues of Subphthalocyanine, Tetrahedron Letters, 36, 1995, 1629-32, the contents of which are incorporated herein by reference in their entirety.

Also, as used herein, the terms "subporphyrin," "subporphyrin compound," and "SubPor compound" refer to compounds of formula

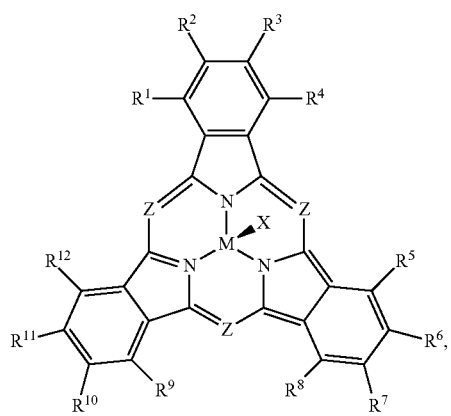

where $R_1$ to $R_{12}$, M, X, and Z are each selected independently, $R_1$ to $R_{12}$, M, and X are as defined above, and Z is N, CH, $CR_{16}$, where $R_{16}$ is may be electron withdrawing or electron donating, and is preferably independently selected from the group consisting of H, straight, branched, or cyclic alkyl, halide, thioalkyl (e.g., $SC_8H_{17}$) thioaryl (e.g., $SC_6H_5$), arylsulfonyl (e.g. $SO_2C_6H_5$), alkylsufonyl (e.g., $SO_2C_8H_{17}$), amino, alkylamino, arylamino, hydroxy, alkoxy, acylamino, acyloxy, phenyl, carboxy, carboxoamido, carboalkoxy, acyl, sulfonyl, cyano, nitro, and related electron accepting and donating groups, well known to those skilled in the art. Subporphyrin compounds are preferably prepared using the synthesis disclosed by Inokuma et al., Tribenzosubporphine: Synthesis and Characterization, Angew. Chem. Int. Ed., 2006, 45, 961-64, the contents of which are incorporated herein in their entirety by reference.

As used herein, the terms "subporphyrazine" and "subporphyrazine compounds" refer to compounds of formula:

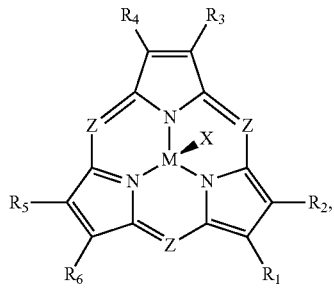

where $R_1$ to $R_6$, M, X, and Z are each selected independently, $R_1$ to $R_6$, M, and X are as defined above, and Z is N, CH, $CR_{16}$, where $R_{16}$ is where $R_{16}$ is may be electron withdrawing or electron donating, and is preferably independently selected from the group consisting of H, straight, branched, or cyclic alkyl, halide, thioalkyl (e.g., $SC_8H_{17}$) thioaryl (e.g., $SC_6H_5$), arylsulfonyl (e.g., $SO_2C_6H_5$), alkylsufonyl (e.g., $SO_2C_8H_{17}$), amino, alkylamino, arylamino, hydroxy, alkoxy, acylamino, acyloxy, phenyl, carboxy, carboxoamido, carboalkoxy, acyl, sulfonyl, cyano, nitro, and related electron accepting and donating groups, well known to those skilled in the art. However, if any adjacent pairs of $R_1$ to $R_6$ are part of a fused aromatic ring system, the compound is a subphthalocyanine or subporphyrin, not a subporphyrazine. Subporphyrazine compounds are preferably prepared using the synthesis disclosed by Rodrigues-Morgade, et al., Synthesis, Characterization, and Properties of Subporphyrazines: A New Class of Nonplanar, Aromatic Macrocycles with Absorption in the Green Region, Che. Euro. J., 2005, 11, 354-360, the contents of which are incorporated herein in their entirety by reference.

Examples of subphthalocyanine compounds useful in the invention include, but are not limited to

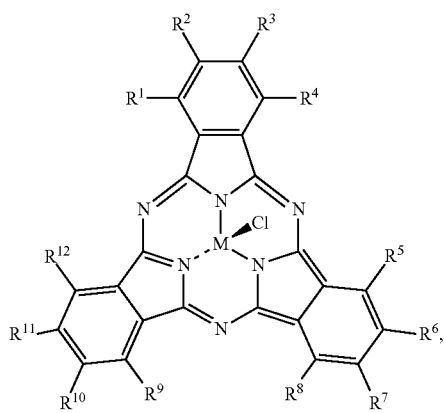

-continued
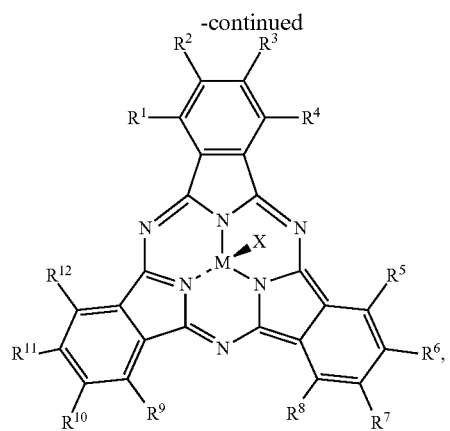
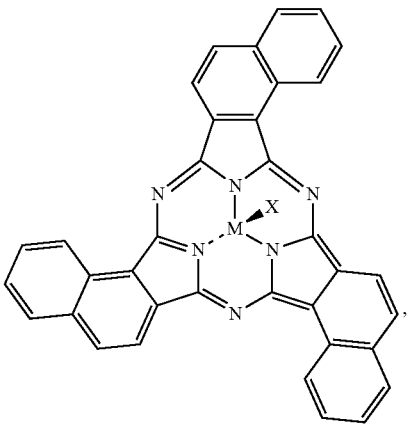
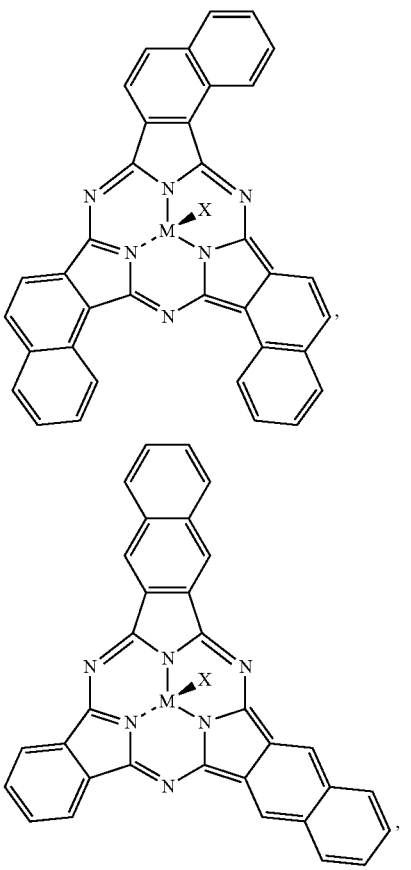
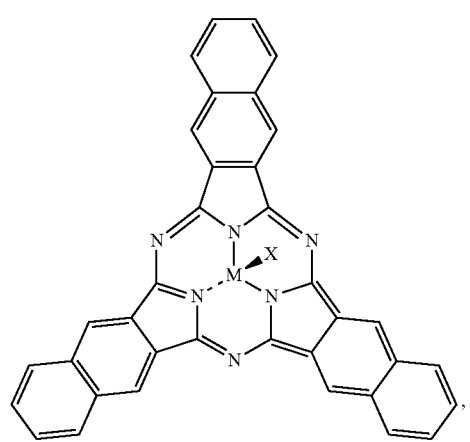
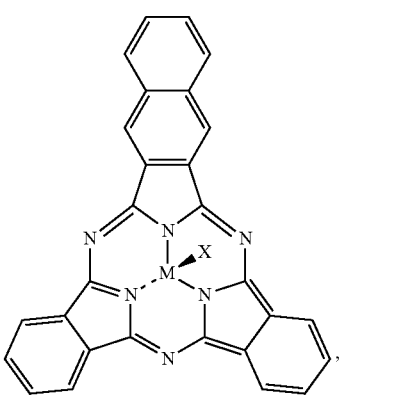

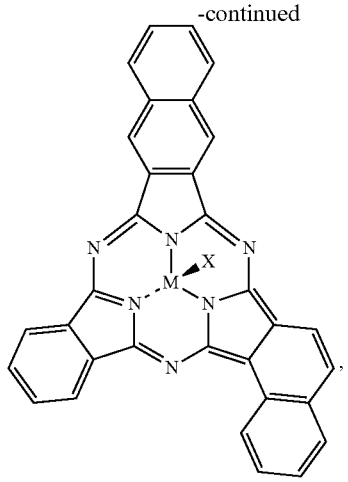
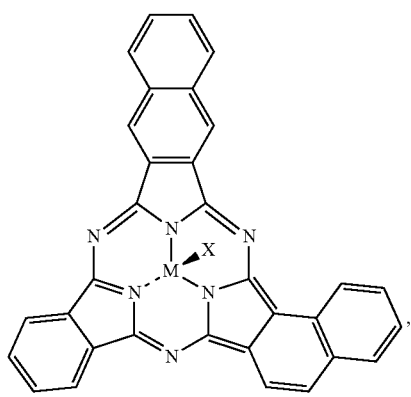
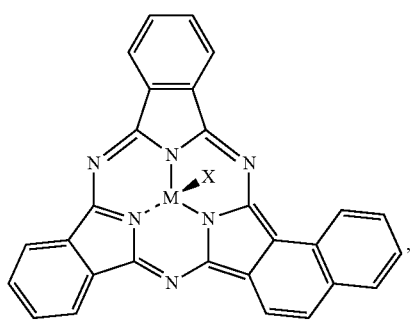
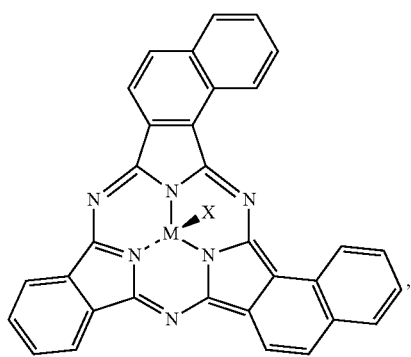
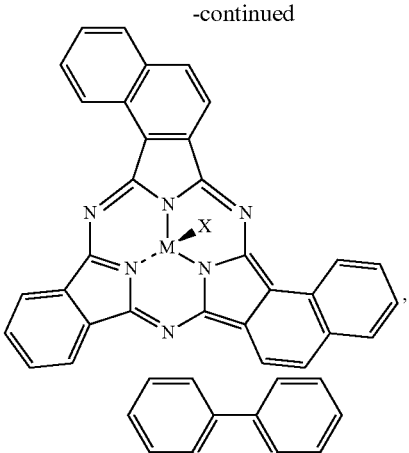
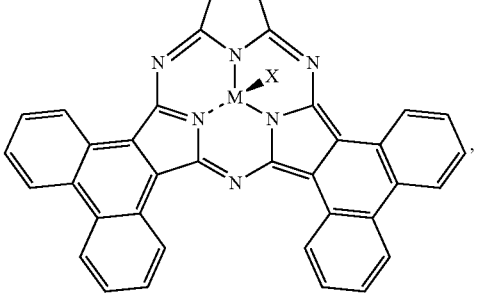
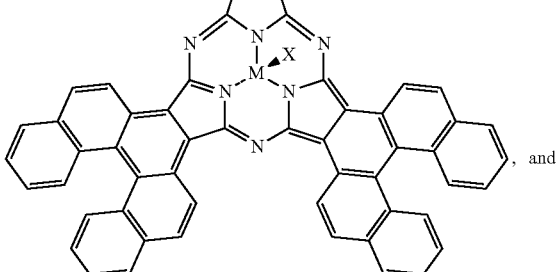
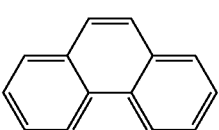, and
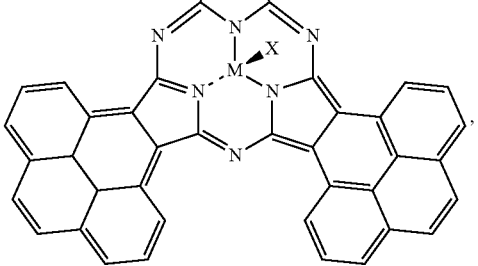

where $R_1$ to $R_{12}$, M, and X are as defined above. Krempl et al., *Synthesis* 2000, 1705-8, the contents of which are incorporated herein by reference in their entirety, disclose reacting hexacyanotriphenylene,

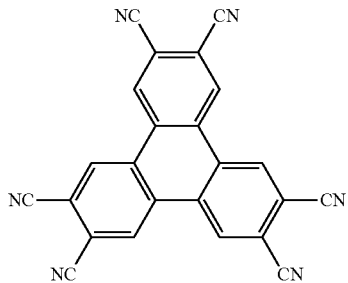

with a phthalocyanine to prepare spherical phthalocyanine molecules, such as compounds having the following structure.

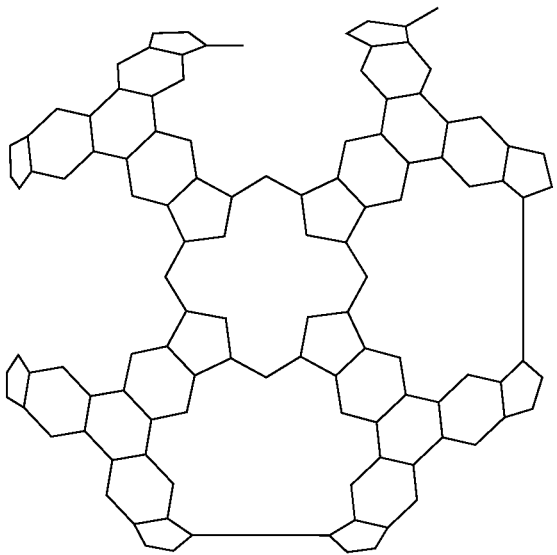

The same technique can be used to prepare oligomeric sheets of SubPc and SubPor compounds, such as a hexacyanotriphenylene SubPc$_{BCl}$, having the following partial structure.

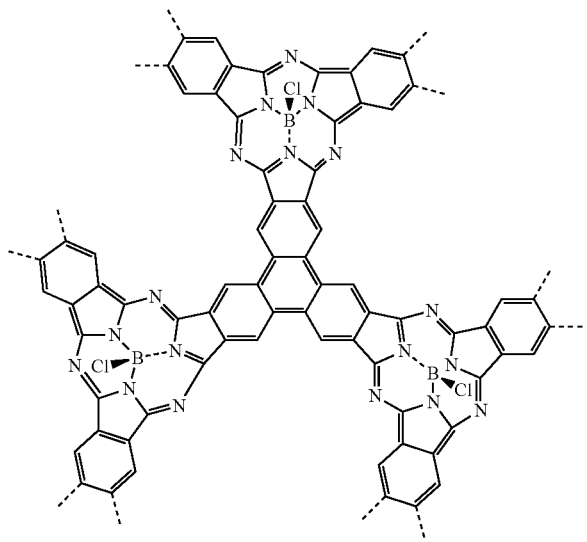

Where the SubPc oligomer is sufficiently large, i.e., comprising a sufficient number of SubPc units, the oligomer will be substantially spherical. Similar subporphyrazine oligomeric sheets of can be prepared using the same technique.

The invention is directed to organic photosensitive optoelectronic devices, comprising an anode, a cathode, and a donor-acceptor heterojunction between the anode and the cathode. The heterojunction comprises a donor-like material and an acceptor-like material, and at least one of the donor-like material and the acceptor-like material comprises a subphthalocyanine, subporphyrin, and/or subporphyrazine compound; and/or the device optionally comprises at least one of a blocking layer or a charge transport layer, wherein the blocking layer and/or the charge transport layer comprises a subphthalocyanine, a subporphyrin, and/or a subporphyrazine compound. In accordance with the invention, photosensitive optoelectronic devices in which subphthalocyanine, subporphyrin, and/or subporphyrazine compounds may be used as donor-like and/or acceptor-like materials include, but are not limited to, solar cells, photodetectors, and photosensors. Heterojunctions useful in the devices of the invention include, but are not limited to planar heterojunctions, mixed heterojunctions, bulk heterojunctions, and hybrid planar-mixed molecular heterojunctions.

A figure of merit for PV devices is the fill factor, FF, which is defined in U.S. Pat. No. 6,451,415, the contents of which are incorporated herein in their entirety by reference, as:

$$FF = (J_{max} \cdot V_{max})/(J_{SC} \cdot V_{OC}) \qquad (1)$$

where $J_{max}$ and $V_{max}$ are the maximum current and voltage obtainable from the device, $J_{SC}$ is the short-circuit current density, and $V_{OC}$ is the open-circuit voltage. The fill factor, FF, is always less than 1, as $J_{sc}$ and $V_{oc}$ cannot be obtained simultaneously in actual use. However, as FF approaches 1, the series or internal resistance of the device decreases, and, thus, the device delivers a greater percentage of the product of $J_{sc}$ and $V_{oc}$ to the load under optimal conditions.

The power conversion efficiency of a PV device, $\eta_p$, is a function of the $V_{oc}$, $J_{sc}$ and FF via:

$$\eta_p = (J_{SC} \cdot V_{oc} \cdot FF)/P_o \qquad (2)$$

where $P_o$ is the incident optical power. As FF is a function of the series resistance, it typically has a value of from about 0.5 to about 0.65 for small molecular weight organic PV devices. The value of $J_{sc}$ is a function of the overlap between the absorption spectrum of the organic donor-like and acceptor-like materials in the device and the solar spectrum, as well as the magnitudes of the extinction coefficients and the thicknesses of the absorbing layers. However, enhanced spectral overlap is preferably provided without a significant loss in exciton diffusion length or in the charge transport properties of the materials. Typically, the value of $V_{oc}$ is about 500 mV at 1 sun for a conventional CuPc/C$_{60}$ PV cell, which is significantly less than the energy of the absorbed photon, i.e., about 2 eV. An increase in $V_{oc}$ without a significant corresponding decrease in $J_{sc}$ or FF would provide a significant improvement in $\eta_p$. However, prior to the present invention, it was difficult, if not impossible, to obtain a significant increase in the value of $V_{oc}$ without an accompanying decrease in $J_{sc}$ and/or FF, limiting any improvement in $\eta_p$.

Figure 9:
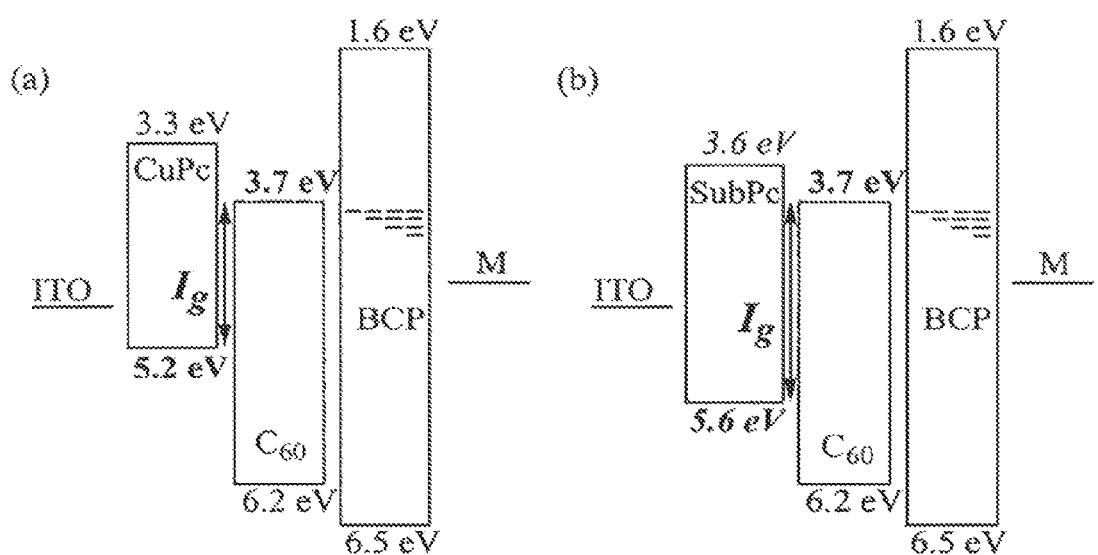
FIG. 9 illustrates a schematic energy level diagram for devices with CuPc and. SubPc donor layers.

Without being bound by theory, it is believed that the value of $V_{oc}$ in an organic photosensitive optoelectronic device, such as an organic solar cell, depends on the energy difference between the lowest unoccupied molecular orbital (LUMO) of the acceptor-like material and the highest occupied molecular orbital (HOMO) of the donor-like material at the heterointerface in a bilayer cell, referred to herein as the interface gap, $I_g$, as illustrated in FIG. 9. Preferably, in organic photosensitive optoelectronic devices of the invention, a significantly greater interface gap is attained with a subphthalocyanine, subporphyrin, and/or subporphyrazine material, particularly when the subphthalocyanine, subporphyrin, and/or subporphyrazine compound is used as the donor-like material, than can be attained in devices using prior art materials. For example, a double heterostructure $SubPc_{BCl}/C_{60}$ thin-film cell has an $I_g$ of 1.9 eV, compared to 1.5 eV for a $CuPc/C_{60}$ cell. The value of $V_{oc}$ of the $SubPc_{BCl}$ cell is also increased by approximately the same magnitude, indicating that the value of $V_{oc}$ may be a function of $I_g$.

Such a double heterojunction $SubPc_{BCl}/C_{60}$ thin-film PV cell provides at least about twice the $V_{oc}$ and $\eta_p$ of a conventional copper phthalocyanine $(CuPc)/C_{60}$ PV cell without a corresponding decrease in $J_{oc}$ and/or FF. The increased values of $V_{oc}$ and $\eta_p$ result from an increase in the value of $I_g$, as a result of the increased oxidation potential of the SubPc compound relative to CuPc.

Substitution of the peripheral substituents on a subphthalocyanine, subporphyrin, or subporphyrazine compound changes the redox properties of the material, modulating the LUMO and HOMO energies of the complex. As the excited state is largely ligand based, in the π-system, the R group directly affects the absorption and emission energies of a subphthalocyanine, subporphyrin, or subporphyrazine compound as well. Generally, electron withdrawing groups would be expected to stabilize the HOMO and LUMO levels, lowering the absolute value of the reduction potential (they typically fall at negative potentials relative to common references), and increase the oxidation potential, thereby moving the HOMO and LUMO energies further from the vacuum level (in energy). In contrast, electron donating groups would be generally expected to destabilize the HOMO and LUMO levels, shifting the HOMO and LUMO levels closer to the vacuum level, relative to the analogous unsubstituted material. However, the HOMO and LUMO levels are not necessarily affected equally. Physical properties published for boron subphthalocyanine chloride analogues with peripheral substitution and boron subnaphthalocyanine chloride (SubNc) are provided in Table 1.

TABLE 1

| Peripheral R group | Abs $\lambda_{max}$ (nm) | $\epsilon$ ($10^4 M^{-1} cm^{-1}$) | $E_S$ (kJ/mol) | $\phi_F$ | $\tau_S$ (ns) | $E_T$ (kJ/mol) | $\phi_T$ | $\tau_T$ (μs) | ΔE (singlet-to-triplet) | red. (V) | ox. (V) |
|---|---|---|---|---|---|---|---|---|---|---|---|
| H | 564 | 6.30 | 209 | 0.25 | 3.3 | 175 | 0.62 | 82 | 30-40 | −1.05 | 1.04 |
| SubNc | 663 | 7.94 | | 0.22 | 2.5 | 130 | 0.68-0.78 | 95 | 42 kJ/mol | | |
| t-Butyl[a] | 570 | 5.01 | 209 | 0.16 | 2.8 | 166 | 0.55 | 127 | | −1.11 | 0.98 |
| $NO_2$[a] | 586 | 3.16 | 203 | 0.20 | 3.2 | 154 | 0.49 | 109 | | −0.57 | 1.34 |
| I[a] | 572 | 5.01 | 208 | 0.01 | <0.5 | 169 | 0.77 | 56 | | −0.92 | 1.13 |
| $SC_8H_{17}$[a] | 586 | 3.16 | 202 | 0.25 | 2.8 | 173 | 0.62 | 130 | | −1.09 | 0.95 |
| $SO_2C_8H_{17}$[a] | 573 | 3.16 | 207 | 0.18 | 3.1 | 162 | 0.25 | 144 | | −0.70 | 1.27 |
| p-tolythio[b] | 606 | 7.94 | 195 | 0.24 | 2.9 | 164 | 0.69 | 157 | | −0.97 | 1.02 |
| p-tolysulfonyl[b] | 591 | 3.98 | 200 | 0.23 | 2.9 | 152 | 0.42 | 132 | | −0.78 | 1.29 |
| F[c] | 570 | 5 to 8 | | | <5 | | | | | −0.53 | 1.50 |

[a]Trisubstituted in the meta position
[b]Hexasubstituted
[c]Dodecasubstituted a

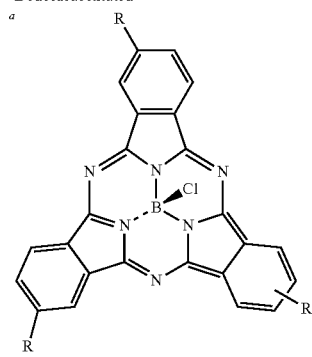

b

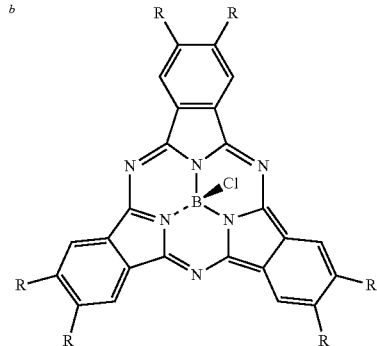

TABLE 1-continued

| Peripheral R group | Abs λ$_{max}$ (nm) | ε (10$^4$M$^{-1}$cm$^{-1}$) | E$_S$ (kJ/mol) | φ$_F$ | τ$_S$ (ns) | E$_T$ (kJ/mol) | φ$_T$ | τ$_T$ (μs) | ΔE (singlet-to-triplet) | red. (V) | ox. (V) |
|---|---|---|---|---|---|---|---|---|---|---|---|
| c SubNc | | | | | | | | | | | |

Modulating the LUMO and HOMO energies allows the donor and acceptor energies of subphthalocyanine and subporphyrin compounds to be tuned for a given application. As a result, in the organic photosensitive optoelectronic device devices of the invention, compounds can be utilized as at least one of the donor-like and the acceptor-like materials by energy matching the subphthalocyanine, subporphyrin, and/or subporphyrazine material with an acceptor-like or donor-like material, and tailoring I$_g$ and V$_{oc}$ for a specific application.

Without being bound by theory, it is also believed that the dipole moment of a molecule may cause charge trapping by the dipole. For example, in boron subphthalocyanine chloride, which has an axial chlorine substituent, the dipole moment of the subphthalocyanine compound may contribute to decreased charge transport and increased series resistance in thicker layers of the subphthalocyanine compound in an organic photosensitive optoelectronic device. The axial substituent has negligible impact on the redox properties of the subphthalocyanine or subporphyrin material, as shown in Table 2 for SubPc compounds in which M is B, and each of R$_1$ to R$_{12}$ is H, indicating that X is not part of the π-system, and, thus, has only a second order effect on the HOMO, LUMO, and excited state energies through M. The axial substituent does influence how subphthalocyanine, subporphyrin, and subporphyrazine compounds pack in a film. However, appropriate substitution of the axial substituent that decreases the dipole moment of a subphthalocyanine, subporphyrin, or subporphyrazine compound, and is expected to increase the charge transport rate, due to a lower level of dipolar charge trapping. Axial groups that are less electron withdrawing will generally provide a subphthalocyanine, subporphyrin, or subporphyrazine complex having a lower dipole moment. Increased charge transport in the subphthalocyanine, subporphyrin, or subporphyrazine material allows the use of thicker subphthalocyanine, subporphyrin, and/or subporphyrazine layers in organic photosensitive optoelectronic devices. In PV cells, thicker subphthalocyanine, subporphyrin, and/or subporphyrazine layers will result in increased J$_{sc}$ and η$_p$. In addition, substitution at the peripheral or axial positions may also affect the packing of the SubPc in thin films, and subsequently affect the transport properties of the film.

TABLE 2

| X | Oxidation Potential (V) | Reduction Potential (V) |
|---|---|---|
| Cl | 0.69 | −1.40 |
| OEt | 0.71 | −1.46 |
| O-tert-butyl | 0.58 | −1.46 |

A lower dipole moment also decreases the likelihood of crystallization of the complex, which can have a deleterious effect on the performance of an organic photosensitive optoelectronic device, when the device is fabricated with a largely amorphous film. A crystalline film is advantageous. However, crystallization after a device is fabricated will result in a decrease in at least one of the performance or lifetime of the device, and a high dipole moment facilitates the crystallization.

While CuPc is a planar compound with an 18 π-electron phthalocyanine macrocycle, unsubstituted subphthalocyanine and subporphyrin compounds comprise three fused aromatic rings centered on a trivalent core, such as boron or a divalent or trivalent metal. The resulting 14 π-electron aromatic macrocycle has a non-planar, cone-shaped structure with a tetrahedral boron or a divalent or trivalent metal center out of plane of the aromatic ligand, and packs in a number of different orientations, depending on the deposition conditions. As will be understood by those skilled in the art, the addition of fused aromatic rings to the rings of the aromatic macrocycle will increase the number of electrons in the π-system of the complex. Extending the π-system will result in derealization, making it behave similarly to a subphthalocyanine or subporphyrin compound substituted with an electron withdrawing group. That is, extending the π-system would be expected to lower the reduction potential, and raise the oxidation potential, thereby lowering the HOMO and LUMO levels. For example, there is a red-shift in the absorption spectrum for SubNc relative to $SubPc_{BCl}$.

Figure 10:
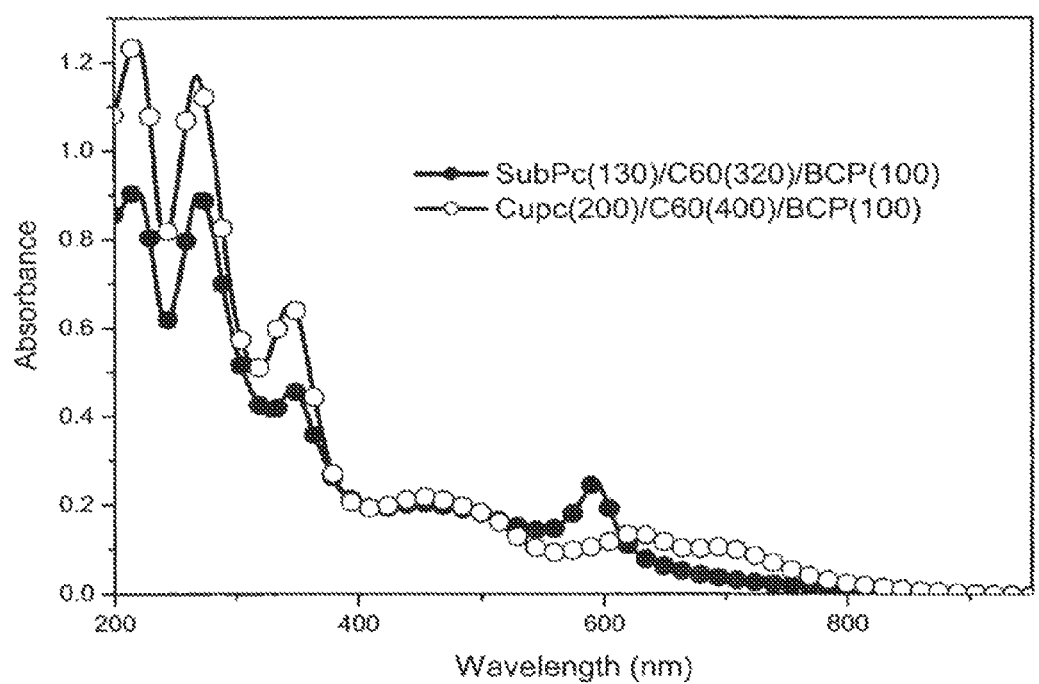
FIG. 10 illustrates absorbance spectra of stacked CuPc (200 Å)/$C_{60}$ (400 Å)/BCP (100 Å) films on quartz and of SubPc$_{BCl}$ (130 Å)/$C_{60}$ (325 Å)/BCP (100 Å) films on quartz.

With strong absorption in the visible and extinction coefficients similar to CuPc, subphthalocyanine and subporphyrin compounds will function as a donor-like material. The first oxidation and reduction potentials of $SubPc_{BCl}$ are 0.69 V and −1.40 V, compared to a ferrocene (Fc/Fc$^+$) reference. Thus, $C_{60}$, having oxidation and reduction potentials of 1.26 V and −1.06 V, compared to Fc/Fc$^+$, is suitable as an acceptor material in a PV cell based on $SubPc_{BCl}$. A comparison of the absorbance spectra of stacked CuPc (200 Å)/$C_{60}$ (400 Å)/BCP (100 Å) films on quartz and of $SubPc_{BCl}$ (130 Å)/$C_{60}$ (325 Å)/BCP (100 Å) films on quartz is illustrated in FIG. 10. With appropriate substitution, the HOMO and LUMO energies of SubPc compounds can be adjusted for use as donor-like materials in particular applications.

Figure 11:
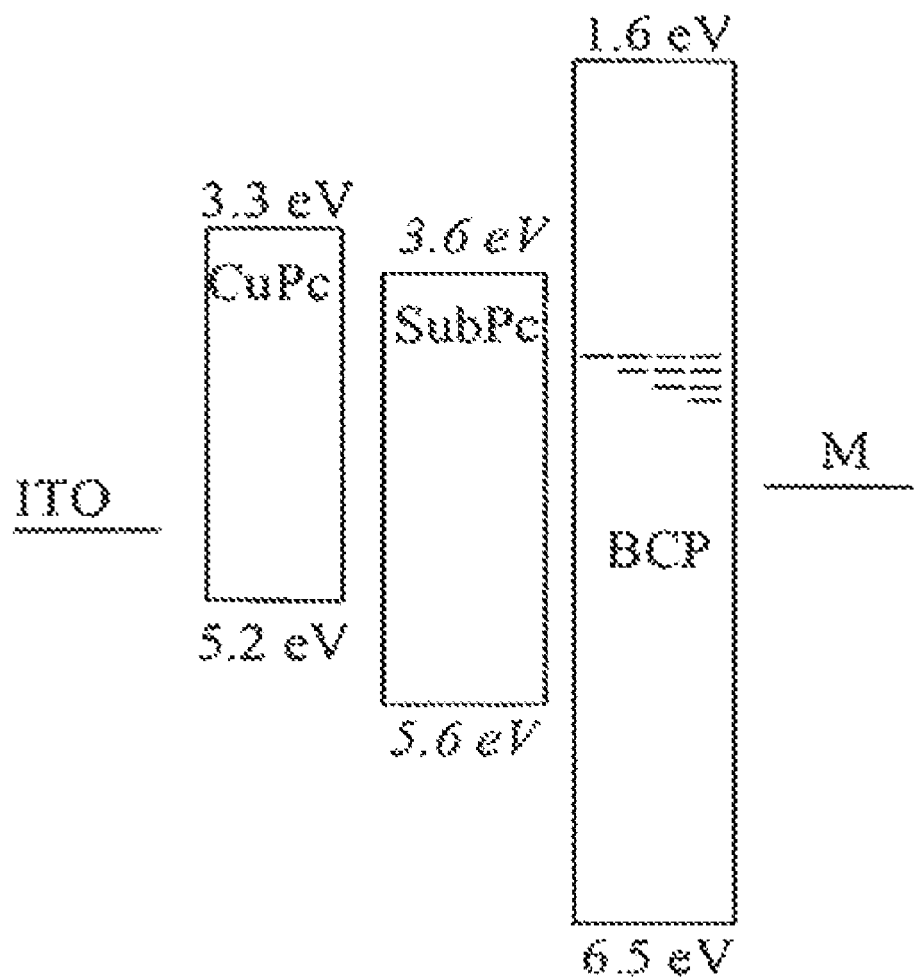
FIG. 11 illustrates the use of a subphthalocyanine compound as an acceptor-like material.

Similarly, a comparison of the HOMO and LUMO energies of CuPc and boron subphthalocyanine chloride, as illustrated in FIG. 11, shows that the subphthalocyanine compound is a suitable acceptor-like material with CuPc as a donor-like material. As with donor-like materials, with appropriate substitution, the HOMO and LUMO energies of SubPc compounds can be adjusted for use as acceptor-like materials in particular applications.

EXAMPLES

The following non-limiting examples are merely illustrative of the preferred embodiments of the present invention, and are not to be construed as limiting the invention, the scope of which is defined by the appended claims.

Boron subphthalocyanine chloride has been incorporated into an organic PV cell as donor-like material with $C_{60}$ as acceptor-like material and exhibits doubling of open circuit voltage and power conversion efficiency relative to a CuPc/C60 standard device.

Photovoltaic cells were grown on ITO-coated glass substrates that were solvent cleaned, and treated in UV-ozone for 10 minutes immediately prior to loading into a high vacuum (~3×10$^{-6}$ Torr)chamber. The organic materials, SubPc (Aldrich), CuPc (Aldrich), $C_{60}$ (MTR Limited), and 2,9-dimethyl-4,7-diphenyl-1,10-phenanthroline (BCP) (Aldrich) were purified by sublimation prior to use. Metal cathode materials, Ag and Al (Alfa Aesar) were used as received. Materials were sequentially grown by vacuum thermal evaporation at the following rates: SubPc (1 Å/sec), $C_{60}$(2 Å/sec), and 2,9-dimethyl-4,7-diphenyl-1,10-phenanthroline (BCP) (1.5 Å/sec) and metals: 1000 Å thick Ag (4 Å/sec) or Al (2.5 Å/sec). The cathode was evaporated through a shadow mask with 1 mm diameter openings. Current-voltage (J-V) characteristics of PV cells were measured under simulated AM1.5G solar illumination (Oriel Instruments) using a Keithley 2420 3A Source Meter. Neutral density filters were used to vary light intensity that was measured with a calibrated broadband optical power meter.

Conventional PV cell structures fabricated as controls were ITO/CuPc (200 Å)/$C_{60}$ (400 Å)/BCP (100 Å) with either a Ag (CuPc1) or Al cathode (CuPc2). The $SubPc_{BCl}$ cells consisted of ITO/$SubPc_{BCl}$ (200 Å)/$C_{60}$ (400 Å)/BCP (100 Å) and a Ag (SubPc1) or Al (SubPc2) cathode. The current-density vs. voltage (J-V) characteristics were measured in the dark and under 1-5 suns AM1.5G simulated illumination uncorrected for solar mismatch.

Although standard devices are made with 200 Å of CuPc, the SubPc devices at 200 Å of SubPc showed poor performance. This is likely due to a high series resistance which suggests that thinner donor layers are necessary for optimal device performance. Since SubPc absorbs at shorter wavelengths than CuPc, an optimal cell structure requires a corresponding decrease in $C_{60}$ thickness to ensure that the SubPc/$C_{60}$ interface is located in a region where the short wavelength light intensity is highest. Following this criterion, devices with the following structure were fabricated: ITO/SubPc (130 Å)/$C_{60}$ (325 Å)/BCP (100 Å) with a Ag or Al cathode. As described above, organic photosensitive devices of the present invention may be used to generate electrical power from incident electromagnetic radiation (e.g., photovoltaic devices) or maybe used to detect incident electromagnetic radiation (e.g., a photodetector or photoconductor cell).

Structure and photovoltaic data for devices illuminated under 1 sun AM1.5G simulated solar illumination and the J-V characteristics for the devices at 1 sun are provided in Table 3. The $V_{oc}$ of SubPc1 and SubPc2 is 150 mV higher than for CuPc cells, although both $J_{sc}$ and FF are reduced, resulting in a reduced power efficiency. This is likely due to a high series resistance which suggests that thinner donor layers are necessary for optimal device performance. As $SubP_{BCl}$ absorbs at shorter wavelengths than CuPc, an optimal cell structure requires a corresponding decrease in $C_{60}$ thickness to ensure that the $SubPc_{BCl}$/$C_{60}$ interface is located in a region where the short wavelength light intensity is highest. Following this criterion, a device with the following structure was fabricated: ITO/$SubPc_{BCl}$ (130 Å)/$C_{60}$ (325 Å)/BCP (100 Å) with a Ag (SubPc3) or Al (SubPc4) cathode.

TABLE 3

| Cell | D/$C_{60}$ (Å) | M$^c$ | $J_{sc}$ (mA cm$^{-2}$) | $V_{oc}$ (V) | FF | V |
|---|---|---|---|---|---|---|
| CuPc1 | 200$^a$/400 | Ag | 4.13 | 0.43 | 0.61 | 1.2 |
| CuPc2 | 200$^a$/400 | Al | 3.07 | 0.42 | 0.58 | 0.9 |
| SubPc1 | 200$^b$/400 | Ag | 2.05 | 0.57 | 0.33 | 0.4 |
| SubPc2 | 200$^b$/400 | Al | 1.83 | 0.58 | 0.36 | 0.4 |
| SubPc3 | 130$^b$/325 | Ag | 3.61 | 0.98 | 0.41 | 1.7 |
| SubPc4 | 130$^b$/325 | Al | 3.36 | 0.97 | 0.57 | 2.1 |

$^a$D = CuPc
$^b$D = $SubPc_{BCl}$
$^c$M is the cathode material

Figure 12:
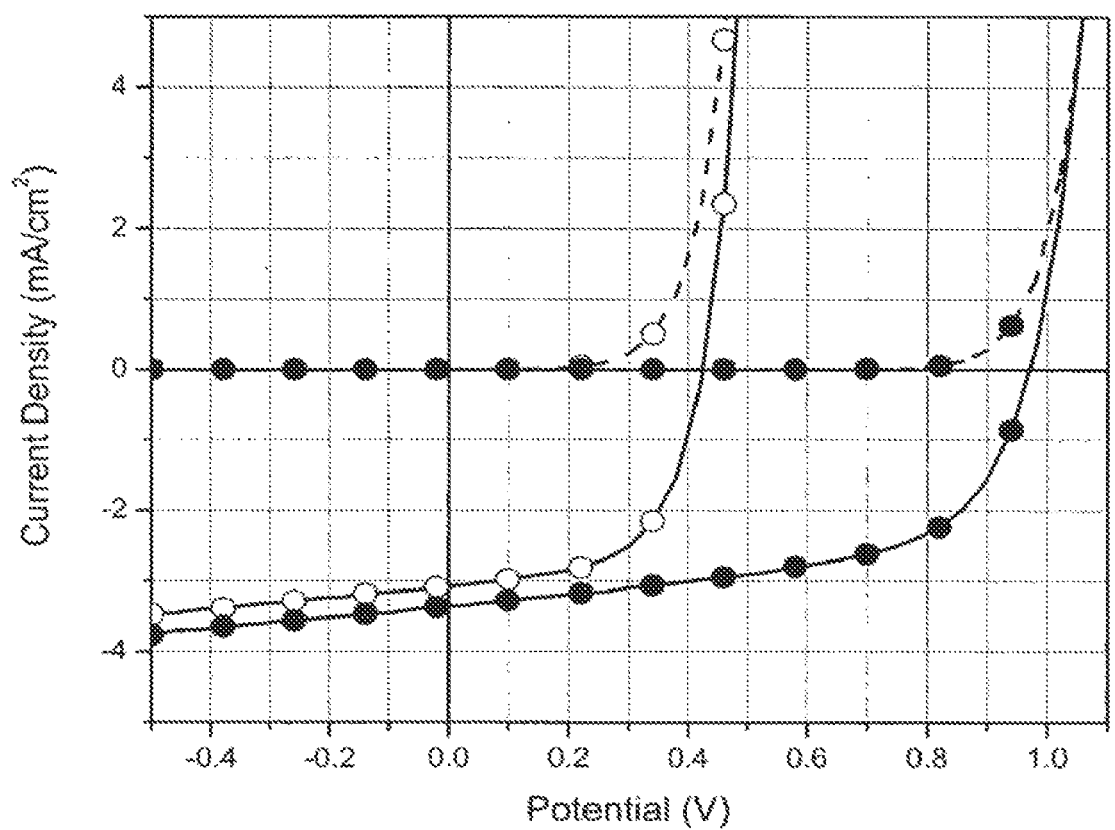
FIG. 12 illustrates J-V characteristics of ITO/CuPc (200 Å)/$C_{60}$ (400 Å)/BCP (100 Å)/Al (1000 Å) and ITO/SubPc (130 Å)/C$_{60}$ (325 Å)/BCP (100 Å)/Al (1000 Å) under 1 sun AM 1.5G simulated illumination and in the dark.
Figure 13:
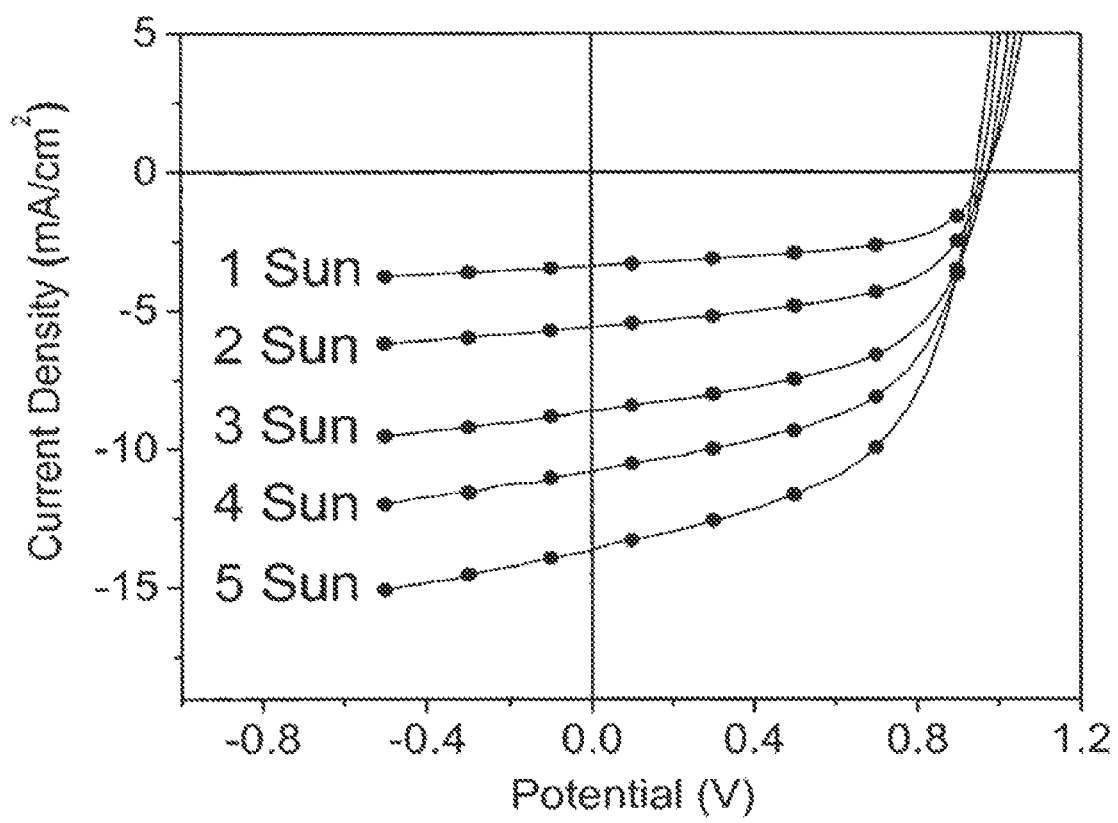
FIG. 13 illustrates J-V characteristics of an ITO/SubPc$_{BCl}$ (130 Å)/C$_{60}$ (325 Å)/BCP (100 Å)/Al (1000 Å) device (SubPc4) under AM1.5G simulated solar illumination at 1-5 suns.

The J-V characteristics of SubPc4 and CuPc2 are shown in FIG. 12, with the ITO/CuPc (200 Å)/$C_{60}$ (400 Å)/BCP (100 Å)/Al (1000 Å) represented by the open circles and the ITO/SubPc (130 Å)/$C_{60}$ (325 Å)/BCP (100 Å)/Al (1000 A) represented by filled circles under 1 sun AM 1.5G simulated illumination (solid) and in the dark (dashed). In this case, $V_{oc}$ of SubPc4 is more than double that of CuPc2, accompanied by a nearly 10 percent increase in $J_{sc}$. Although the SubPc absorption is blue-shifted relative to that of CuPc with a decreased absorbance at λ=700 nm, as illustrated in FIG. 10, this is compensated by the increased absorbance at λ=590 nm, which is in a higher intensity region of the solar spectrum. $V_{oc}$ and FF of SubPc4 are nearly independent of light intensity between 1 and 5 suns, as illustrated in FIG. 13, while the power conversion efficiency achieves a maximum value of $\eta_p=2.1\pm0.2$ percent at 1 sun. The photovoltaic data for the ITO/SubPc$_{BCl}$(130 Å)/C$_{60}$(325 Å)/BCP (100 Å)/Al (1000 Å) device under AM1.5G simulated solar illumination at 1-5 suns is also set forth in Table 4.

TABLE 4

| Power | $J_{sc}$ (mA cm$^{-2}$) | $V_{oc}$ (V) | FF | $\eta$ |
|---|---|---|---|---|
| 1 Sun | 3.4 | 0.97 | 0.58 | 2.1 |
| 2 Sun | 5.6 | 0.97 | 0.57 | 1.7 |
| 3 Sun | 8.6 | 0.97 | 0.56 | 1.6 |
| 4 Sun | 10.8 | 0.96 | 0.55 | 1.6 |
| 5 Sun | 13.6 | 0.94 | 0.54 | 1.5 |

Photovoltaic data for devices having varying thicknesses of the SubPc$_{BCl}$ layer in an ITO/SubPc$_{BCl}$ (x Å)/C$_{60}$ (325 Å)/BCP (100 Å)/Al (1000 Å) device under AM1.5G simulated solar illumination at 1 sun are provided in Table 5.

TABLE 5

| x (Å) | $J_{sc}$ (mA cm$^{-2}$) | $V_{oc}$ (V) | FF | $\eta$ |
|---|---|---|---|---|
| 100 | 3.07 | 0.81 | 0.48 | 1.3 |
| 115 | 2.63 | 0.88 | 0.60 | 1.5 |
| 130 | 3.36 | 0.97 | 0.57 | 2.1 |
| 200 | 1.83 | 0.58 | 0.36 | 0.4 |

As illustrated in the energy level diagram for the CuPc and SubPc$_{BCl}$ devices illustrated in FIG. 9, the SubPc$_{BCl}$/C$_{60}$ device has an $I_g$ that is 400 meV greater than that of the CuPc/C$_{60}$ device, correlating to an increase of $V_{oc}$ of approximately the same magnitude (550 mV). The significant increase in $V_{oc}$ is attributed to the smaller HOMO energy of SubPc$_{BCl}$ and the subsequent increase in $I_g$, showing that $V_{oc}$ is dependent on $I_g$. $V_{oc}$ can be increased by series resistance, which may, in turn, depend on the presence of impurities or crystalline disorder. The increase in $V_{oc}$ is approximately 20 percent higher than that in $I_g$, indicating that resistance is affecting $V_{oc}$. However the high FF's indicate that resistance alone cannot account for the increased $V_{oc}$.

Varying the metal cathode has a minimal effect on $V_{oc}$. However, CuPc1 with a Ag cathode shows an increased $J_{sc}$ and FF relative to the analogous device with Al (CuPc2). It is unclear why such an effect on $J_{sc}$ and FF is observed, whereas $V_{oc}$ is the same for both devices. Alternatively, for SubPc$_{BCl}$ FF decreases for the Ag device (SubPc3) compared to the Al device (SubPc4). However, the SubPc$_{BCl}$/C$_{60}$ based PV cells have more than twice the $V_{oc}$ of conventional CuPc/C$_{60}$ cells, resulting in a more than doubling of the cell power conversion efficiency. By using a strongly absorbing donor material with a deep HOMO, $I_g$, and, consequently, $V_{oc}$, is increased without a concomitant reduction in $J_{sc}$. This indicates that $I_g$ is likely a dominant factor in determining $V_{oc}$ in organic heterojunction cells.

The characteristics of a PV device using SubPc$_{BCl}$ as an acceptor like material are described below. Photovoltaic cells were grown on ITO-coated glass substrates that were solvent cleaned and treated in UV-ozone for 10 minutes immediately prior to loading into a high vacuum (~3×10$^{-6}$ Torr) chamber. The organic materials, SubPc$_{BCl}$ (Aldrich), CuPc (Aldrich), and 2,9-dimethyl-4,7-diphenyl-1,10-phenanthroline (BCP) (Aldrich) were purified by sublimation prior to use. Metal cathode material, Al (Alfa Aesar) was used as received. Films were sequentially grown by vacuum thermal evaporation: CuPc (200 Å, 2 Å/sec), SubPc$_{BCl}$ (130 Å, 1 Å/sec), BCP (100 Å, 1.5 Å/sec), and Al (1000 Å, 2.5 Å/sec). The cathode was evaporated through a shadow mask with 1 mm diameter openings. Current-voltage (J-V) characteristics of PV cells were measured under simulated AM 1.5G solar illumination (Oriel Instruments) using a Keithley 2420 3A Source Meter. Neutral density filters were used to vary light intensity that was measured with a calibrated broadband optical power meter.

Figure 14:
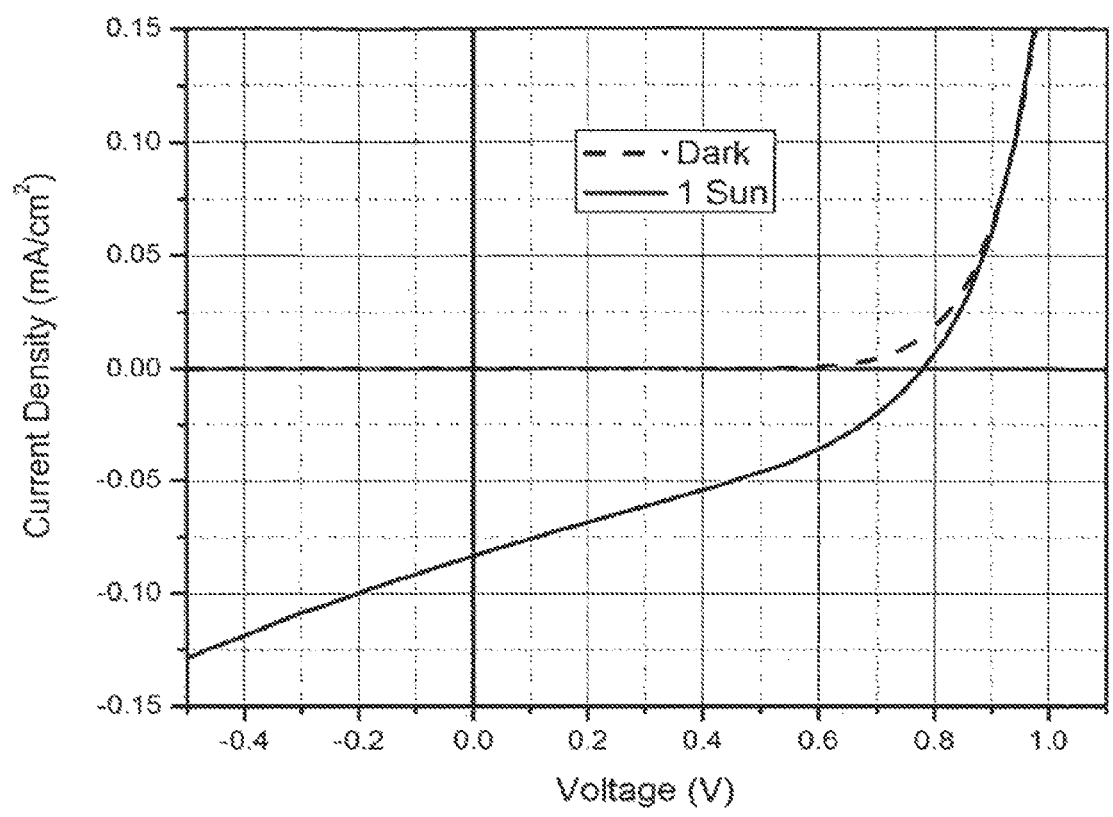
FIG. 14 illustrates J-V characteristics of ITO/CuPc (200 Å)/SubPc (130 Å)/BCP (100 Å)/Al (1000 Å) under 1 sun AM 1.5G simulated illumination and in the dark.

J-V characteristics at 1 sun are shown in FIG. 14 and listed in Table 6, demonstrating that devices of the invention may be prepared with SubPc materials that the materials act as acceptor-like materials. The low power conversion efficiency of the devices is a consequence of low $J_{sc}$ and low FF. However, those values may be increased through device optimization.

TABLE 6

| $J_{sc}$ (mA cm$^{-2}$) | $V_{oc}$ (V) | FF | $\eta$ (%) |
|---|---|---|---|
| 0.08 | 0.78 | 0.36 | 0.02 |

Specific examples of the invention are illustrated and/or described herein. However, it will be appreciated that modifications and variations of the invention are covered by the above teachings and within the purview of the appended claims without departing from the spirit and scope of the invention.

We claim:

1. An organic photosensitive optoelectronic device, comprising an anode, a cathode, and a donor-acceptor heterojunction between the anode and the cathode, the heterojunction comprising a donor-like material and an acceptor-like material, wherein at least one of the donor-like material and the acceptor-like material comprises a subphthalocyanine, a subporphyrin, and/or a subporphyrazine compound, wherein the subporphyrin or subporphyrazine compound comprises boron.

2. The organic photosensitive optoelectronic device of claim 1, wherein the donor-like material comprises a subporphyrin compound.

3. The organic photosensitive optoelectronic device of claim 2, wherein the subporphyrin compound is of the formula

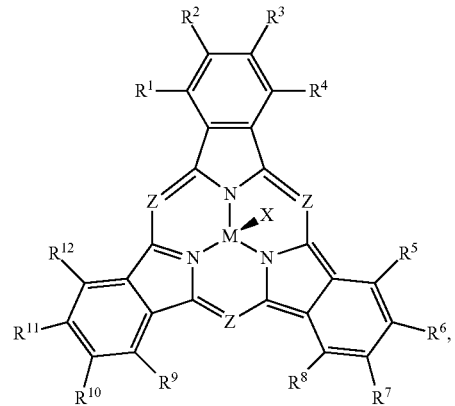

wherein R$_1$ to R$_{12}$, M, and X are each selected independently, at least one of R$_1$ to R$_{12}$ is electron donating or electron withdrawing, and the remaining R$_1$ to R$_{12}$ are independently selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro, and any of $R_1$ to $R_{12}$ that are adjacent can be part of a fused aliphatic or aromatic ring, wherein the ring may contain one or more atoms other than carbon, M is boron and X is an anionic group, and Z is N, CH, $CR_{16}$, wherein $R_{16}$ is selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro.

4. The organic photosensitive optoelectronic device of claim 2, wherein the subporphyrin compound is of the formula

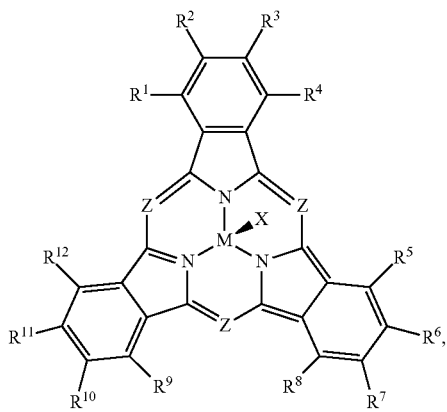

wherein $R_1$ to $R_{12}$, M, and X are each selected independently, $R_1$ to $R_{12}$ are independently selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro, and any of $R_1$ to $R_{12}$ that are adjacent can be part of a fused aliphatic or aromatic ring, wherein the ring may contain one or more atoms other than carbon, M is boron and X is an anionic group, and Z is N, CH, $CR_{16}$, wherein $R_{16}$ is selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro.

5. The organic photosensitive optoelectronic device of claim 4, wherein X is selected from the group consisting of halide, alkoxy, phenoxy, hydroxy, aryl, phenyl, and $OCOCR_{13}R_{14}R_{15}$, wherein $R_{13}$, $R_{14}$, and $R_{15}$ are independently selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro.

6. The organic photosensitive optoelectronic device of claim 2, wherein the subporphyrin compound is an oligomer.

7. The organic photosensitive optoelectronic device of claim 1, wherein the acceptor-like material comprises a subporphyrin compound.

8. The organic photosensitive optoelectronic device of claim 7, wherein the subporpohyrin compound is of the formula

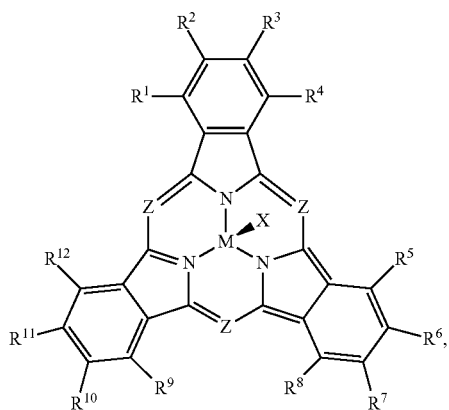

wherein $R_1$ to $R_{12}$, M, and X are each selected independently, at least one of $R_1$ to $R_{12}$ is electron donating or electron withdrawing, and the remaining $R_1$ to $R_{12}$ are independently selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro, and any of $R_1$ to $R_{12}$ that are adjacent can be part of a fused aliphatic or aromatic ring, wherein the ring may contain one or more atoms other than carbon, M is boron and X is an anionic group, and Z is N, CH, $CR_{16}$, wherein $R_{16}$ is selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro.

9. The organic photosensitive optoelectronic device of claim 7, wherein the subporphyrin compound is of the formula

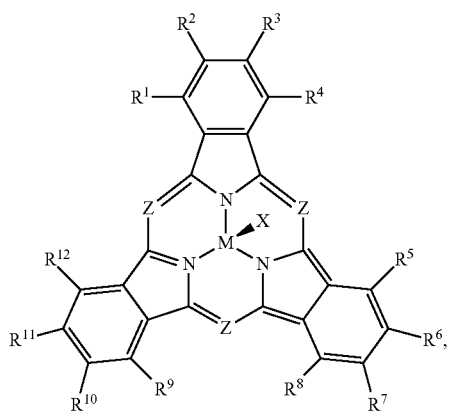

wherein $R_1$ to $R_{12}$, M, and X are each selected independently, $R_1$ to $R_{12}$ are independently selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro, and any of $R_1$ to $R_{12}$ that are adjacent can be part of a fused aliphatic or aromatic ring, wherein the ring may contain one or more atoms other than carbon, M is boron and X is an anionic group, and Z is N, CH, $CR_{16}$, wherein $R_{16}$ is selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro.

10. The organic photosensitive optoelectronic device of claim 7, wherein the subporphyrin compound is an oligomer.

11. The organic photosensitive optoelectronic device of claim 1, wherein the donor-like material comprises a subporphyrazine compound.

12. The organic photosensitive optoelectronic device of claim 11, wherein the subporphyrazine compound is of formula:

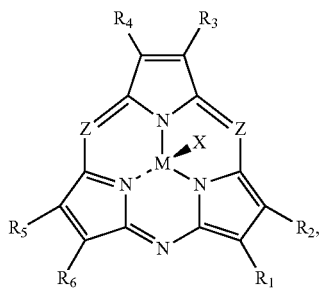

wherein $R_1$ to $R_6$, M, X and Z are each selected independently, at least one of $R_1$ to $R_6$ is electron donating or electron withdrawing, and the remaining $R_1$ to $R_6$ are selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro, M is boron and X is an anionic group, and Z is N, CH, $CR_{16}$, wherein $R_{16}$ is selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro.

13. The organic photosensitive optoelectronic device of claim 11, wherein the subporphyrazine compound is of formula:

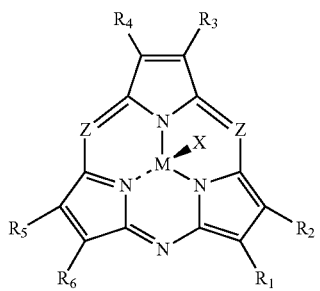

wherein $R_1$ to $R_6$, M, X and Z are each selected independently, $R_1$ to $R_6$ are selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro, M is boron and X is an anionic group, and Z is N, CH, $CR_{16}$, wherein $R_{16}$ is selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro.

14. The organic photosensitive optoelectronic device of claim 13, wherein X is selected from the group consisting of halide, alkoxy, phenoxy, hydroxy, aryl, phenyl, and $OCOCR_{13}R_{14}R_{15}$, wherein $R_{13}$, $R_{14}$, and $R_{15}$ are independently selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro.

15. The organic photosensitive optoelectronic device of claim 1, wherein the acceptor-like material comprises a subporphyrazine compound.

16. The organic photosensitive optoelectronic device of claim 15, wherein the subporphyrazine compound is of formula:

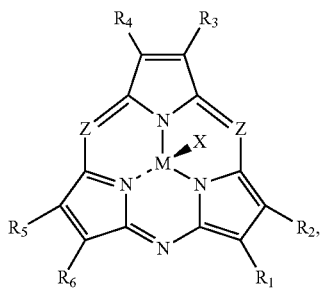

wherein $R_1$ to $R_6$, M, X and Z are each selected independently, at least one of $R_1$ to $R_6$ is electron donating or electron withdrawing, and the remaining $R_1$ to $R_6$ are selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro, M is boron and X is an anionic group, and Z is N, CH, $CR_{16}$, wherein $R_{16}$ is selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro.

17. The organic photosensitive optoelectronic device of claim 15, wherein the subporphyrazine compound is of formula:

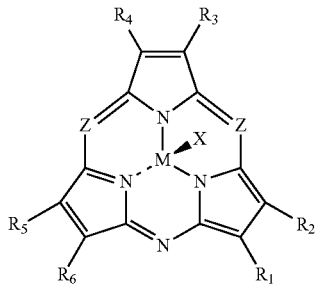

wherein $R_1$ to $R_6$, M, X and Z are each selected independently, $R_1$ to $R_6$ are selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro, M is boron and X is an anionic group, and Z is N, CH, $CR_{16}$, wherein $R_{16}$ is selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro.

18. The organic photosensitive optoelectronic device of claim 17, wherein X is selected from the group consisting of halide, alkoxy, phenoxy, hydroxy, aryl, phenyl, and $OCOCR_{13}R_{14}R_{15}$, wherein $R_{13}$, $R_{14}$, and $R_{15}$ are independently selected from the group consisting of H, straight, branched, or cyclic alkyl, halide, thioalkyl, thioaryl, arylsulfonyl, alkylsufonyl, amino, alkylamino, arylamino, hydroxy, alkoxy, acylamino, acyloxy, phenyl, carboxy, carboxoamido, carboalkoxy, acyl, sulfonyl, cyano, and nitro.

* * * * *